(12) United States Patent
Ichiba

(10) Patent No.: US 11,275,611 B2
(45) Date of Patent: Mar. 15, 2022

(54) INFORMATION PROCESSING DEVICE, INFORMATION PROCESSING METHOD, AND COMPUTER-READABLE RECORDING MEDIUM RECORDING PROGRAM

(71) Applicant: FUJITSU LIMITED, Kawasaki (JP)

(72) Inventor: Toshiyuki Ichiba, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 327 days.

(21) Appl. No.: 16/711,515

(22) Filed: Dec. 12, 2019

(65) Prior Publication Data

US 2020/0257557 A1   Aug. 13, 2020

(30) Foreign Application Priority Data

Feb. 8, 2019   (JP) .............................. JP2019-021949

(51) Int. Cl.
    *G06F 9/48*      (2006.01)
    *G06F 3/06*      (2006.01)
    *G06F 30/327*    (2020.01)
    *G06F 30/343*    (2020.01)

(52) U.S. Cl.
    CPC .......... *G06F 9/4881* (2013.01); *G06F 3/0604* (2013.01); *G06F 3/0653* (2013.01); *G06F 3/0673* (2013.01); *G06F 30/327* (2020.01)

(58) Field of Classification Search
    None
    See application file for complete search history.

(56) References Cited

U.S. PATENT DOCUMENTS

2016/0275213 A1   9/2016   Tomita

FOREIGN PATENT DOCUMENTS

| EP | 0481615 A2 | 4/1992 |
|---|---|---|
| JP | 4-263331 A | 9/1992 |
| JP | 2016-177454 A | 10/2016 |

*Primary Examiner* — Farley Abad
*Assistant Examiner* — Dayton Lewis-Taylor
(74) *Attorney, Agent, or Firm* — Fujitsu Patent Center

(57) ABSTRACT

An information processing device includes: a memory; and a processor coupled to the memory and configured to: store first execution information that includes first processing for a plurality of data and second processing executed subsequently to the first processing; convert the first execution information into second execution information by making a start timing of the second processing earlier than an end timing of the first processing, under a restriction of an execution order in which a data read in the second processing is executed after a data write in the first processing for each of the plurality of data, on the basis of an order of data writes included in the first processing and an order of data reads included in the second processing; and output the second execution information.

15 Claims, 20 Drawing Sheets

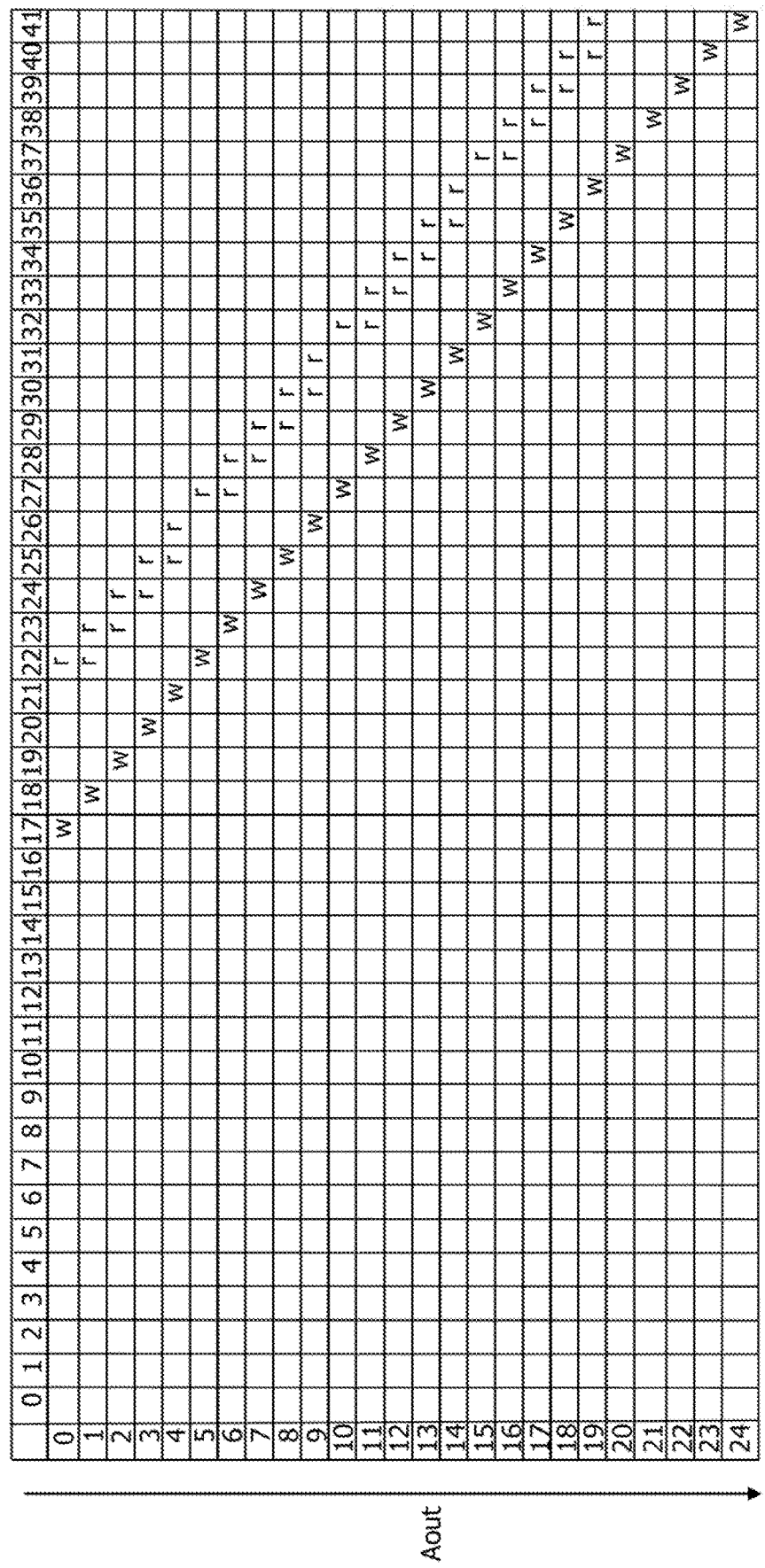

INFORMATION PROCESSING DEVICE, INFORMATION PROCESSING METHOD, AND COMPUTER-READABLE RECORDING MEDIUM RECORDING PROGRAM

CROSS-REFERENCE TO RELATED APPLICATION

This application is based upon and claims the benefit of priority of the prior Japanese Patent Application No. 2019-21949, filed on Feb. 8, 2019, the entire contents of which are incorporated herein by reference.

FIELD

The embodiment discussed herein is related to an information processing device, an information processing method, and a program.

BACKGROUND

A high-level synthesis technology is known in which a logic circuit such as a field-programmable gate array (FPGA) is synthesized by a computer. In the high-level synthesis technology, an operation description in which an algorithm to be processed by a logic circuit is described in a programming language such as C language is converted into a hardware description language (HDL) circuit description.

Japanese Laid-open Patent Publication No. 2016-177454 and Japanese Laid-open Patent Publication No. 4-263331 are disclosed as related art.

SUMMARY

According to an aspect of the embodiments, an information processing device includes: a memory; and a processor coupled to the memory and configured to: store first execution information that includes first processing for a plurality of data and second processing executed subsequently to the first processing; convert the first execution information into second execution information by making a start timing of the second processing earlier than an end timing of the first processing, under a restriction of an execution order in which a data read in the second processing is executed after a data write in the first processing for each of the plurality of data, on the basis of an order of data writes included in the first processing and an order of data reads included in the second processing; and output the second execution information.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 6A and 6B are a diagram illustrating orders of data writes and data reads included in the preprocessing and the main processing;

FIG. 7 is a diagram illustrating orders of data writes and data reads included in the main processing;

FIG. 10 is a diagram illustrating orders of the data writes and the data reads when the execution order change processing is ended;

FIGS. 15A and 15B are a diagram illustrating orders of the data writes and the data reads in a case where the execution order change processing is omitted.

DESCRIPTION OF EMBODIMENTS

To realize high-performance processing by the FPGA, it is desirable to use pipeline processing. According to the high-level synthesis technology, a pipeline circuit can be manufactured by describing pipeline processing by using C language and the like.

In relation to parallel/pipeline computers, a global instruction scheduler for computers is known that generates a program dependency graph including control dependency and data dependency to schedule instructions.

The pipeline processing executed by the logic circuit includes a plurality of processes, and in a case where those processes are executed in order, the next process is started with a delay from the start time of the preceding process by its execution time. For this reason, with the conventional high-level synthesis technology, it is difficult to manufacture a pipeline circuit that efficiently executes pipeline processing.

Note that, such a problem occurs not only in pipeline processing executed by a hardware circuit but also in pipeline processing executed by software.

In one aspect, the execution time of a plurality of processes described by execution information may be shorten.

Hereinafter, an embodiment will be described in detail with reference to the drawings.

Figure 1A:
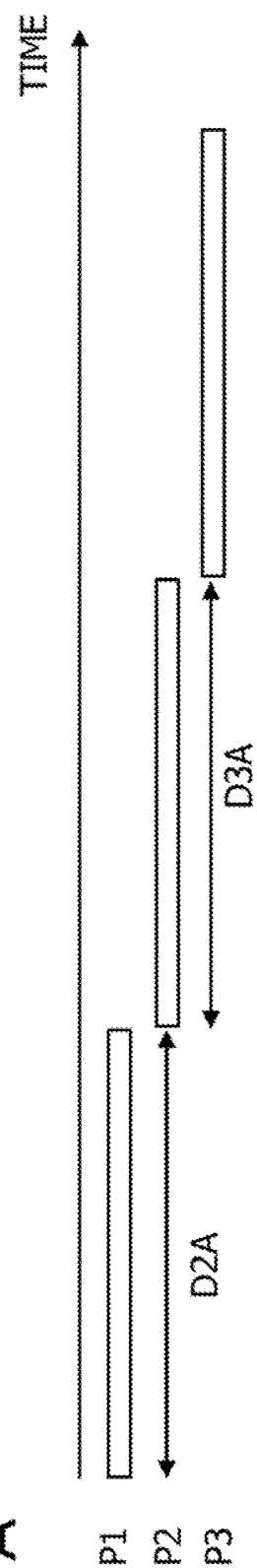
FIGS. 1A and 1B each are a diagram illustrating processes executed by a logic circuit.
Figure 1B:
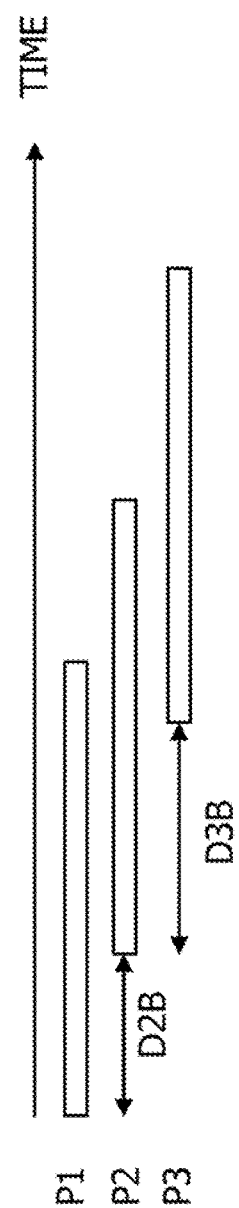

FIGS. 1A and 1B each illustrate an example of processes executed by a logic circuit. FIG. 1A illustrates an example of a delay time in pipeline processing including a process P1, a process P2, and a process P3. Each of the process P1, the process P2, and the process P3 is a process for multidimensional array data in, for example, image encoding, deep learning, scientific computing, and the like. In the case of image encoding, two-dimensional array data that stores pixel values of an image block is used as array data.

As illustrated in FIG. 1A, in the conventional high-level synthesis technology, a circuit description is generated that executes the process P1, the process P2, and the process P3 in order. In this case, a delay time D2A represents a time from the start time of the process P1 to the start time of the process P2, and a delay time D3A represents a time from the start time of the process P2 to the start time of the process P3.

FIG. 1B illustrates an example of a delay time in a case where two consecutive processes are temporally caused to overlap each other. In this case, a delay time D2B from the start time of the process P1 to the start time of the process P2 is shortened from the delay time D2A, and a delay time D3B from the start time of the process P2 to the start time of the process P3 is shortened from the delay time D3A. Thus, compared with the pipeline processing of FIG. 1A, the total execution time of the process P1 to the process P3 is greatly shortened.

However, in a case where the next process is executed using a processing result of the preceding process, it is difficult to cause those processes to overlap each other.

Figure 2:
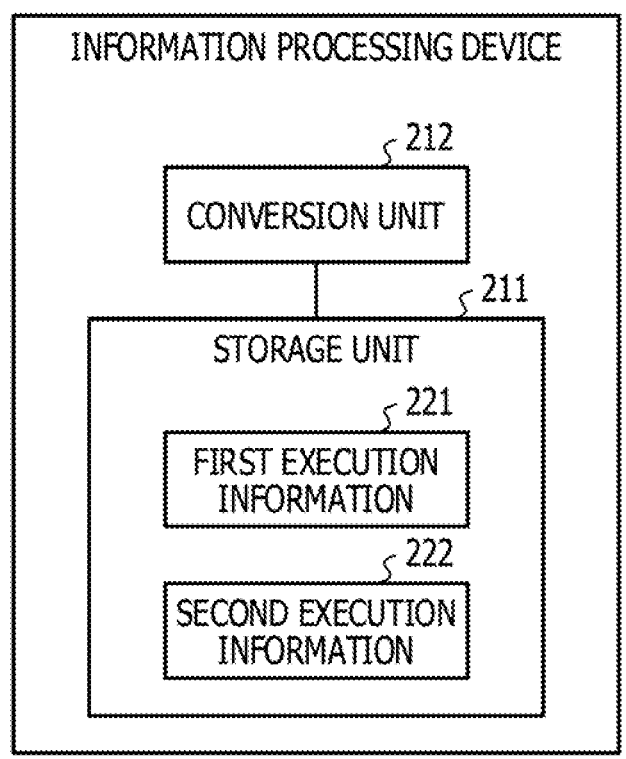
FIG. 2 is a functional configuration diagram of an information processing device.

FIG. 2 illustrates a functional configuration example of an information processing device (computer) of the embodiment. An information processing device 201 of FIG. 2 includes a storage unit 211 and a conversion unit 212. The storage unit 211 stores first execution information 221 including first processing for a plurality of data and second processing executed subsequently to the first processing. The conversion unit 212 converts the first execution information 221 into second execution information 222.

Figure 3:
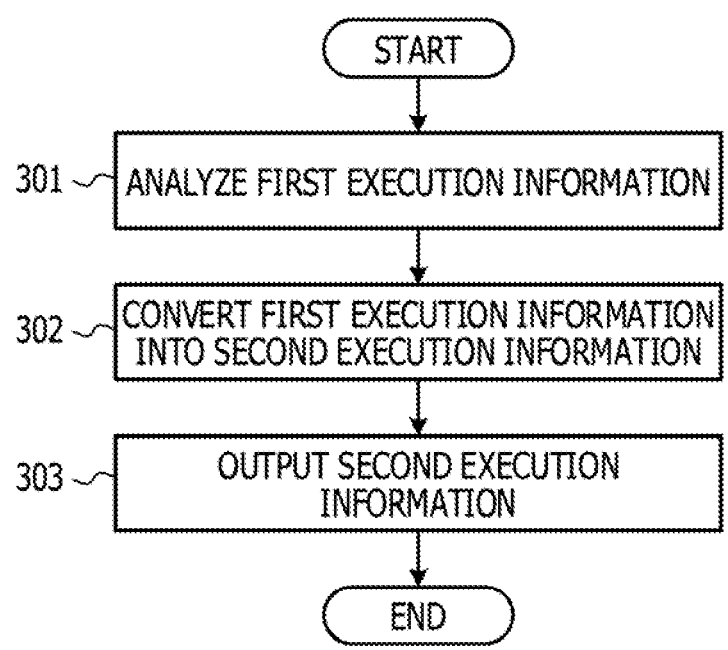
FIG. 3 is a flowchart of conversion processing.

FIG. 3 is a flowchart illustrating an example of conversion processing performed by the information processing device 201 of FIG. 2. First, the conversion unit 212 analyzes the first execution information 221 (step 301).

Next, the conversion unit 212 makes the start timing of the second processing earlier than the end timing of the first processing, under a restriction of an execution order, on the basis of an order of data writes included in the first processing and an order of data reads included in the second processing (step 302). As a result, the first execution information 221 is converted into the second execution information 222. The restriction of the execution order indicates that a data read in the second processing is executed after a data write in the first processing for each of the plurality of data. Then, the conversion unit 212 outputs the second execution information 222 (step 303).

According to the information processing device 201 of FIG. 2, the execution time can be shortened of a plurality of processes described by execution information.

For example, in the case of the process P1 to the process P3 illustrated in FIG. 1A, on the basis of an order of data writes included in the process P1 and an order of data reads included in the process P2, under the restriction of the execution order, the start timing of the process P2 is made earlier than the end timing of the process P1. As a result, the delay time D2A can be reduced as illustrated in FIG. 1B. Similarly, on the basis of an order of data writes included in the process P2 and an order of data reads included in the process P3, under the restriction of the execution order, the start timing of the process P3 is made earlier than the end timing of the process P2, whereby the delay time D3A can be reduced.

Next, a specific example will be described of execution information used for manufacturing the logic circuit. In this case, as the first execution information 221, for example, an operation description described in a programming language such as C language is used, and as the second execution information 222, for example, a circuit description described in HDL or the like is used. A case is assumed where an operation description of pipeline processing includes the following preprocessing and main processing, and the main processing is executed next to the preprocessing.

```
(1) Preprocessing
  for (x=0; x<5; x++)
  for (y=0; y<5; y++)
  in[y][x]= ...
(2) Main processing
  for (x=0; x<5; x++) {
  out[0][x]=in[0][x];
  }
  for(y=1; y<5; y++) {
  for (x=0; x<5; x++) {
  a=out[y−1][x];
  b=(x<4) ? out[y−1][x+1]:0;
  out[y][x]=func(a,b,in[y][x]);
  }
  }
```

The preprocessing and the main processing are examples of the first processing and the second processing. The preprocessing is a loop process for writing data to each element of the 5×5 two-dimensional array in[y][x] (x, y=0 to 4), and includes 25 data writes. The main processing is processing that generates the 5×5 two-dimensional array out[y][x] indicating an operation result from in[y][x], and includes a loop process L1 that generates out[0][x] and a loop process L2 that generates out[y][x] (y≠0).

The loop process L1 includes five data reads that read data from in[0][x] (x=0 to 4) and five data writes that write the read data to out[0][x]. On the other hand, the loop process L2 includes the following processing.

(A1) 20 data reads that read in[y][x] (x=0 to 4, y=1 to 4)
(A2) 20 data reads that read out[y−1][x] (x=0 to 4, y=1 to 4)
(A3) 16 data reads that read out[y−1][x+1] (x=0 to 3, y=1 to 4)
(A4) 20 data operations that generate out[y][x] (x=0 to 4, y=1 to 4) by using the read data
(A5) 20 data writes that write the generated out[y][x] (x=0 to 4, y=1 to 4)

Figure 4:
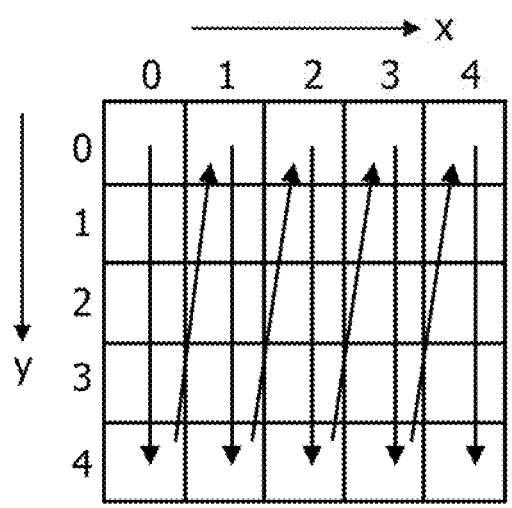
FIG. 4 is a diagram illustrating an execution order of data writes in preprocessing.

FIG. 4 illustrates an execution order of data writes for in[y][x] in the preprocessing. The array in[y][x] is represented by a 5×5 block, and the horizontal direction represents the x direction, and the vertical direction represents the y direction. In the preprocessing, in[y][x] is accessed in the order of in[0][0], in[1][0], in[2][0], . . . .

Figure 5A:
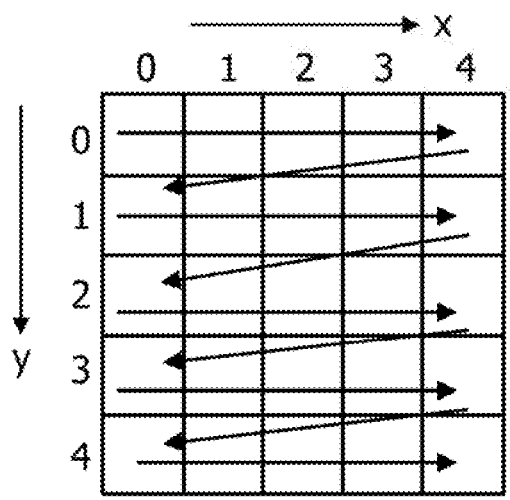
FIGS. 5A and 5B are diagrams respectively illustrating an execution order of data reads and data dependency in main processing.
Figure 5B:
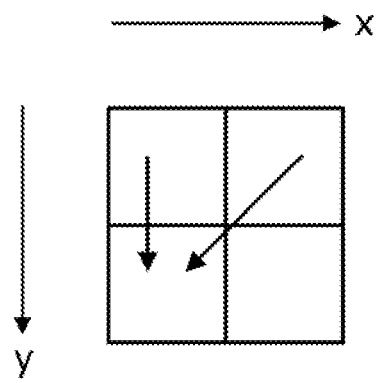

FIGS. 5A and 5B respectively illustrate an execution order of data reads and data dependency in the main processing. FIG. 5A illustrates the execution order of data reads for in[y][x] in the loop process L1. In the loop process L1, in[y][x] is accessed in the order of in[0][0], in[0][1], in[0][2], . . . .

FIG. 5B illustrates the data dependency in the loop process L2. Since out[y][x] (x=0 to 3, y=1 to 4) is generated by using the upper element out[y−1][x] and the upper right element out[y−1][x+1], out[y][x] has data dependency on those elements.

As described above, since the loop process L2 has the data dependency, it is difficult to replace a loop process for the subscript y (outer loop process) and a loop process for the subscript x (inner loop process) with each other. Thus, in a case where the execution order of the data writes for in[y][x] in the preprocessing is determined in advance, the execution order of the data reads for in[y][x] in the main processing is an execution order different from that of the preprocessing.

Figure 6A:
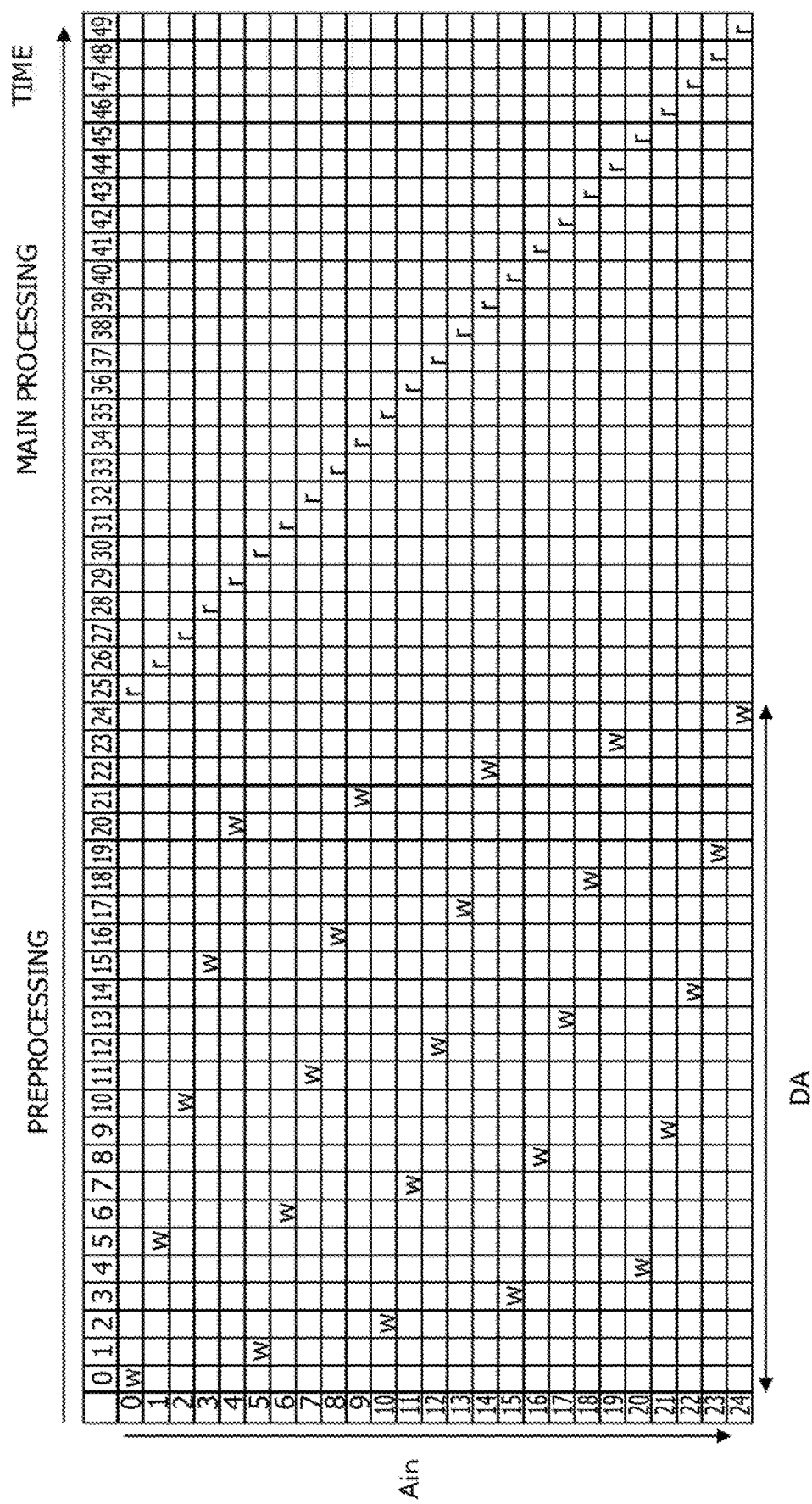
Figure 6B:
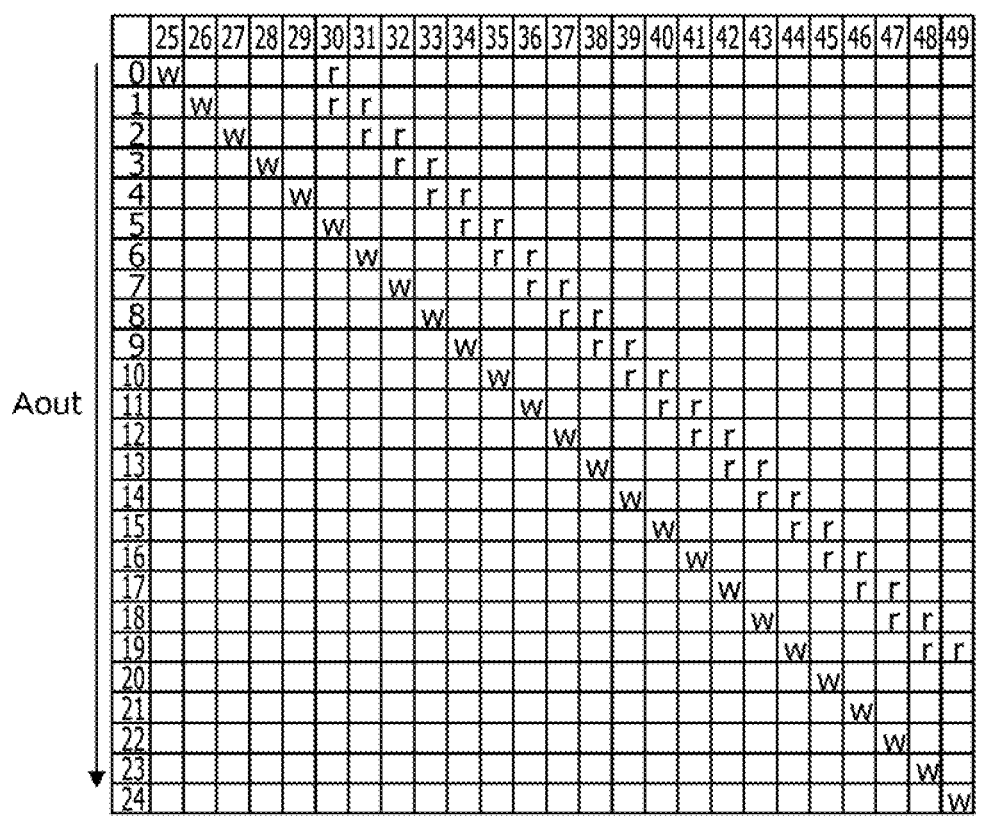

FIGS. 6A and 6B illustrate an example of orders of data writes and data reads included in the preprocessing and the main processing. Each column in a table of FIGS. 6A and 6B represents time, and each row represents an address of in[y][x] or out[y][x] in a storage area. The time is an example of an execution timing of the processing. Ain represents an address of in[y][x], and Aout represents an address of out[y][x]. Ain and Aout of FIGS. 6A and 6B are described by the following equations.

$$Ain = x + y*5 \,(x=0 \text{ to } 4, y=0 \text{ to } 4) \quad (1)$$

$$Aout = x + y*5 \,(x=0 \text{ to } 4, y=0 \text{ to } 4) \quad (2)$$

For example, addresses Ain of in[0][0] to in[0][4] are 0 to 4, respectively, and addresses Ain of in[1][0] to in[1][4] are 5 to 9, respectively. Addresses Ain of in[2][0] to in[2][4] are 10 to 14, respectively, and addresses Ain of in[3][0] to in[3][4] are 15 to 19, respectively. Addresses Ain of in[4][0] to in[4][4] are 20 to 24, respectively.

The address Aout of out[y][x] is similar to the address Ain. However, in an actual storage area, the address Ain and the address Aout are assigned to different positions for each combination of the values of x and y.

A symbol "r" described in each cell in the table of FIGS. 6A and 6B represents a data read for an address corresponding to the row of the cell, and is executed at a time corresponding to the column of the cell. On the other hand, a symbol "w" described in each cell represents a data write for an address corresponding to the row of the cell, and is executed at a time corresponding to the column of the cell.

Processes from time 0 to time 24 correspond to the preprocessing, and processes from time 25 to time 49 correspond to the main processing. Each column includes one or more processes for writing one data, and these processes are regarded as one operation unit.

For example, an operation unit at each time from the time 0 to the time 24 includes one data write for Ain. The operation unit is executed, whereby data is written to in[y][x].

An operation unit at each time from the time 25 to the time 29 includes one data read for Ain and one data write for Aout. The operation unit is executed, data read from in[0][x] is written to out[0][x].

An operation unit at each of the time 30 to the time 33, the time 35 to the time 38, the time 40 to the time 43, and the time 45 to the time 48 includes one data read for Ain, two data reads for Aout, and one data write to Aout. The operation unit is executed, whereby an operation result is generated by using data read from in[y][x], out[y−1][x], and out[y−1][x+1], and the operation result is written to out[y][x].

An operation unit at each time of the time 34, the time 39, the time 44, and the time 49 includes one data read for Ain, one data read for Aout, and one data write for Aout. The operation unit is executed, whereby an operation result is generated by using data read from in[y][x] and out[y−1][x], and the operation result is written to out[y][x].

Note that, the operation unit at each time of the time 30 to time 49 also includes a data operation (not illustrated) that generates the operation result. The order of the 25 data writes included in the preprocessing corresponds to the execution order illustrated in FIG. 4, and the order of the 25 operation units included in the main processing corresponds to the execution order illustrated in FIG. 5A.

In the pipeline processing of FIGS. 6A and 6B, a delay time DA from the start time 0 of the preprocessing to the start time 25 of the main processing is 25.

On the basis of the order of the data writes for in[y][x] in the preprocessing and the order of operation units in the main processing, the conversion unit 212 moves an operation unit at one time to another time, thereby changing the order of operation units included in the main processing.

At this time, the conversion unit 212 changes the order of the operation units for each element of out[y][x] while observing the restriction of the execution order in which the data read is executed after the data write. As a result, the data dependency of out[y][x] is maintained.

Next, the conversion unit 212 makes the start time of the main processing earlier than the end time of the preprocessing on the basis of the order of the data writes for in[y][x] in the preprocessing and the order of the data reads for in[y][x] in the main processing. As a result, the first execution information 221 is converted into the second execution information 222. At this time, the conversion unit 212 changes the start time of the main processing to the earliest possible time while observing the restriction of the execution order in which the data read in the main processing is executed after the data write in the preprocessing for each element of in[y][x].

The start time of the main processing is made earlier than the end time of the preprocessing, whereby the delay time DA can be reduced, and the total execution time of the pipeline processing can be shortened. Furthermore, on the basis of the order of the data writes for in[y][x] in the preprocessing, the order of the operation units included in the main processing is changed, whereby the delay time DA can be further reduced.

Figure 7:
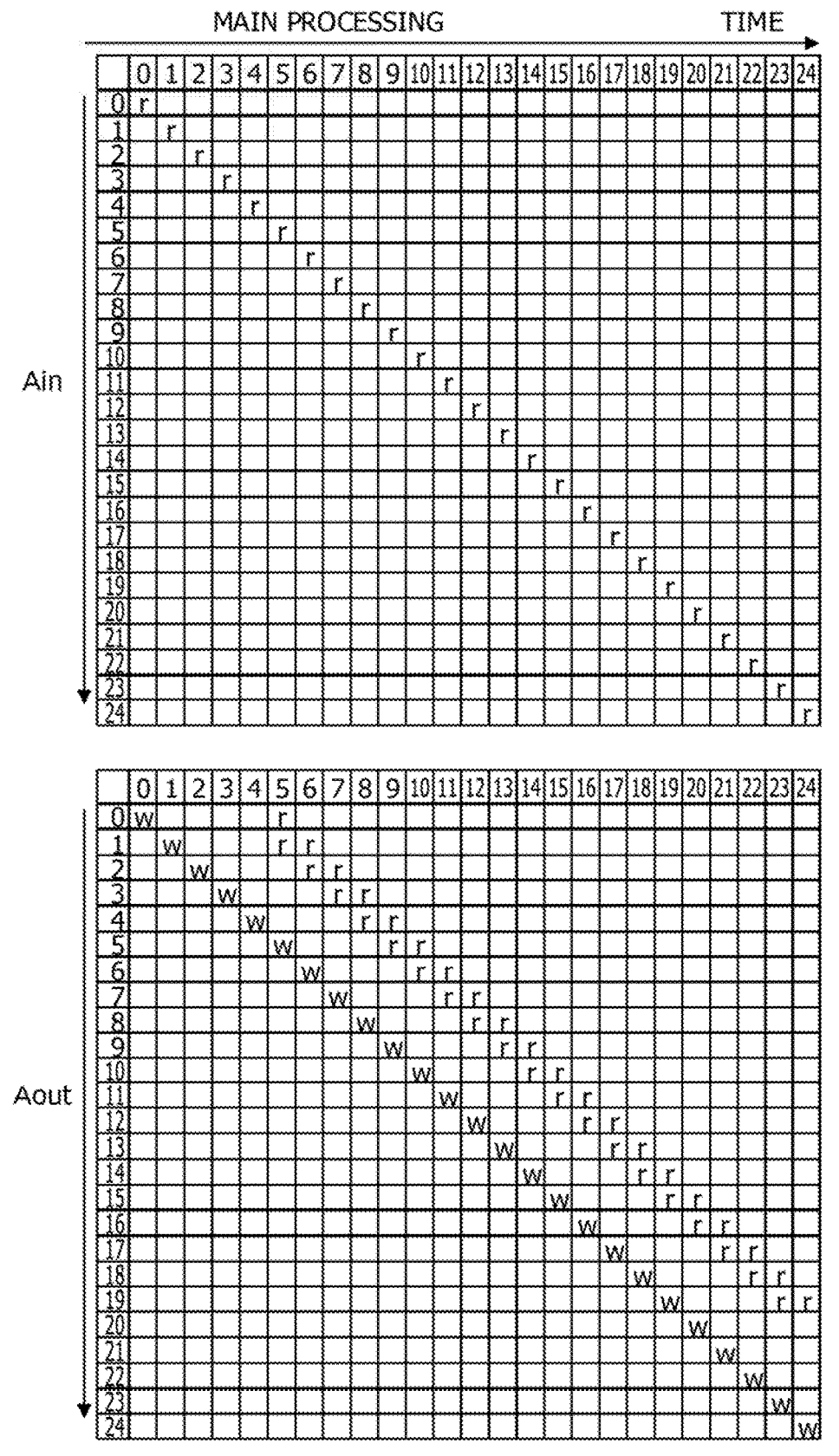

FIG. 7 illustrates orders of data writes and data reads included in the main processing of FIGS. 6A and 6B. However, in FIG. 7, the time 25 to the time 49 of FIGS. 6A and 6B are changed to the time 0 to the time 24, respectively.

In execution order change processing that changes the order of the operation units included in the main processing, the conversion unit 212 selects the elements of in[y][x] in order in accordance with the order of the data writes for in[y][x] in the preprocessing. Next, the conversion unit 212 selects a specific operation unit including a data read that reads the selected in[y][x] from the operation units included in the main processing.

As described above, the execution order of the data reads for in[y][x] in the main processing is different from the execution order of the data writes for in[y][x] in the preprocessing. For this reason, there may be an operation unit including a data read that reads in[y][x] written after the selected in[y][x] between the start time of the main processing and the time of the selected specific operation unit. In this case, the conversion unit 212 changes the order of the operation units included in the main processing to make the time of the specific operation unit earlier.

According to such execution order change processing, the execution order of the data reads for in[y][x] in the main processing can be brought close to the execution order of the data writes for in[y][x] in the preprocessing. Thus, the interval between the start time of the preprocessing and the start time of the main processing can be shortened as much as possible.

However, to preserve the data dependency of out[y][x], the restriction of the execution order is observed for each element of out[y][x]. For example, in the operation unit at the time 5 in the main processing, out[0][0] corresponding to Aout=0 and out[0][1] corresponding to Aout=1 are read. On the other hand, out[0][0] is written at the time 0, and out[0][1] is written at the time 1. For this reason, it is prohibited to move the operation unit at the time 5 to the time 0 or the time 1.

According to the order of the data writes for in[y][x] in the preprocessing, first, in[0][0] to be written by the data write at the time 0 is selected. In the main processing, an operation unit including a data read that reads the selected in[0][0] is the operation unit at the time 0. Since the time 0 is the start time of the main processing, there is no need to move the operation unit at the time 0.

Next, in[1][0] to be written by the data write at the time 1 in the preprocessing is selected.

Figure 8:
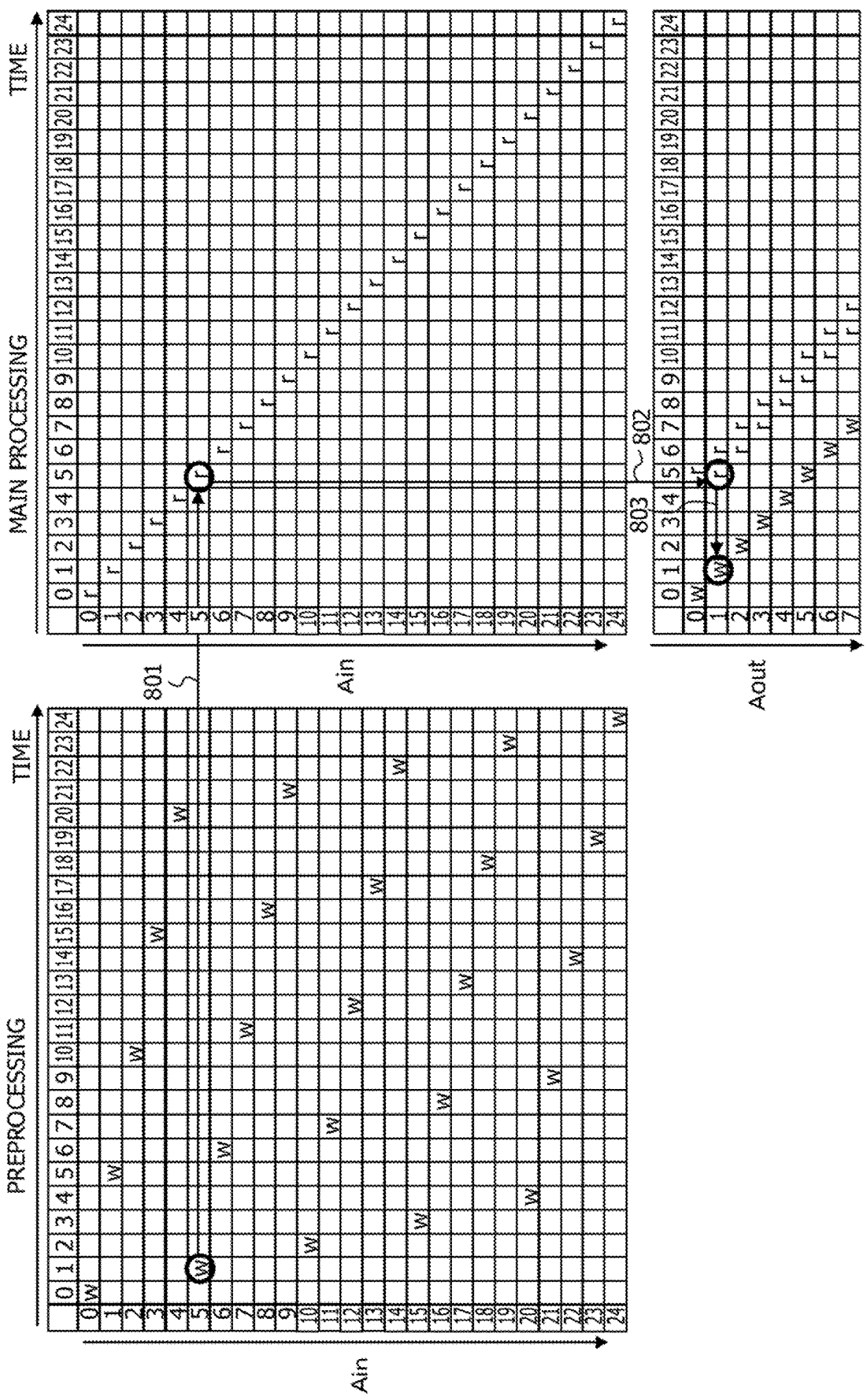
FIG. 8 is a diagram illustrating execution order change processing in a case where in[1][0] is selected.

FIG. 8 illustrates an example of the execution order change processing in a case where in[1][0] is selected. In this case, as indicated by an arrow 801, in the main processing, the operation unit at the time 5 is selected including a data read that reads the selected in[1][0]. Between the time 0 and the time 5, there are four operation units including data reads that read in[0][1] to in[0][4] written after in[1][0].

Furthermore, the operation unit at the time 5 includes a data read that reads out[0][1] as indicated by an arrow 802. As indicated by an arrow 803, out[0][1] is written by the data write at the time 1 in the main processing. Thus, it is prohibited to move the operation unit at the time 5 to the time 1. The operation units at the time 0 and the time 1 in the main processing are therefore not changed, and the operation unit at the time 5 moves to time 2.

Next, in[2][0] to be written by the data write at the time 2 in the preprocessing is selected.

Figure 9:
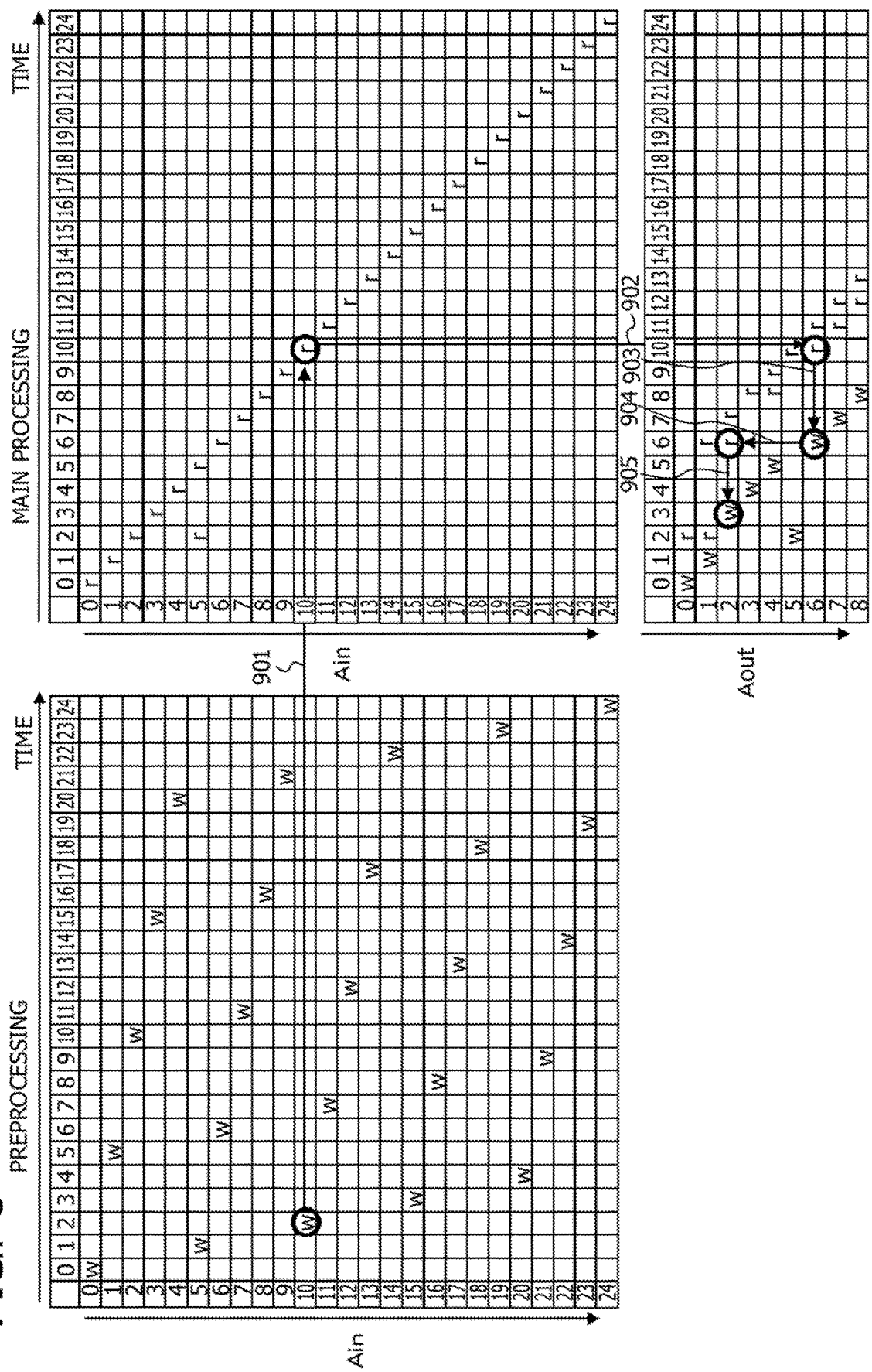
FIG. 9 is a diagram illustrating the execution order change processing in a case where in[2][0] is selected.

FIG. 9 illustrates an example of the execution order change processing in a case where in[2][0] is selected. In FIG. 9, the operation unit at the time 5 in the main processing of FIG. 8 has moved to the time 2, and the operation units at the time 2 to the time 4 have moved to the time 3 to the time 5.

In this case, as indicated by an arrow 901, in the main processing, the operation unit at the time 10 is selected including a data read that reads the selected in[2][0]. Between the time 0 and the time 10, there are eight operation units including data reads that read in[0][1] to in[0][4] and in[1][1] to in[1][4] written after in[2][0].

Furthermore, the operation unit at the time 10 includes a data read that reads out[1][1] as indicated by an arrow 902. As indicated by an arrow 903, out[1][1] is written by the data write at the time 6 in the main processing.

The operation unit at the time 6 includes a data read that reads out[0][2] as indicated by an arrow 904. As indicated by an arrow 905, out[0][2] is written by the data write at the time 3 in the main processing.

As described above, in the main processing, there is a case where an operation unit that is a dependent destination of an operation unit having data dependency further has data dependency on another operation unit. The conversion unit 212 therefore recursively identifies an operation unit that generates out[y][x] to be read by the selected operation unit. Then, the conversion unit 212 changes the order of the operation units included in the main processing so that the identified operation unit is executed before the selected operation unit.

As a result, the order of the operation units can be changed while all the data dependencies of out[y][x] in the main processing are maintained.

In the example of FIG. 9, the operation unit at the time 6 is executed next to the operation unit at the time 3, and the operation unit at the time 10 is executed next to the operation unit at the time 6, whereby all the data dependencies are preserved. The operation units at the time 0 to the time 3 are therefore not changed, the operation unit at the time 6 moves to the time 4, and the operation unit at the time 10 moves to the time 5.

Thereafter, similar operation is repeated in accordance with the order of the data writes for in[y][x], whereby the order of the operation units included in the main processing is further changed.

Figure 10:
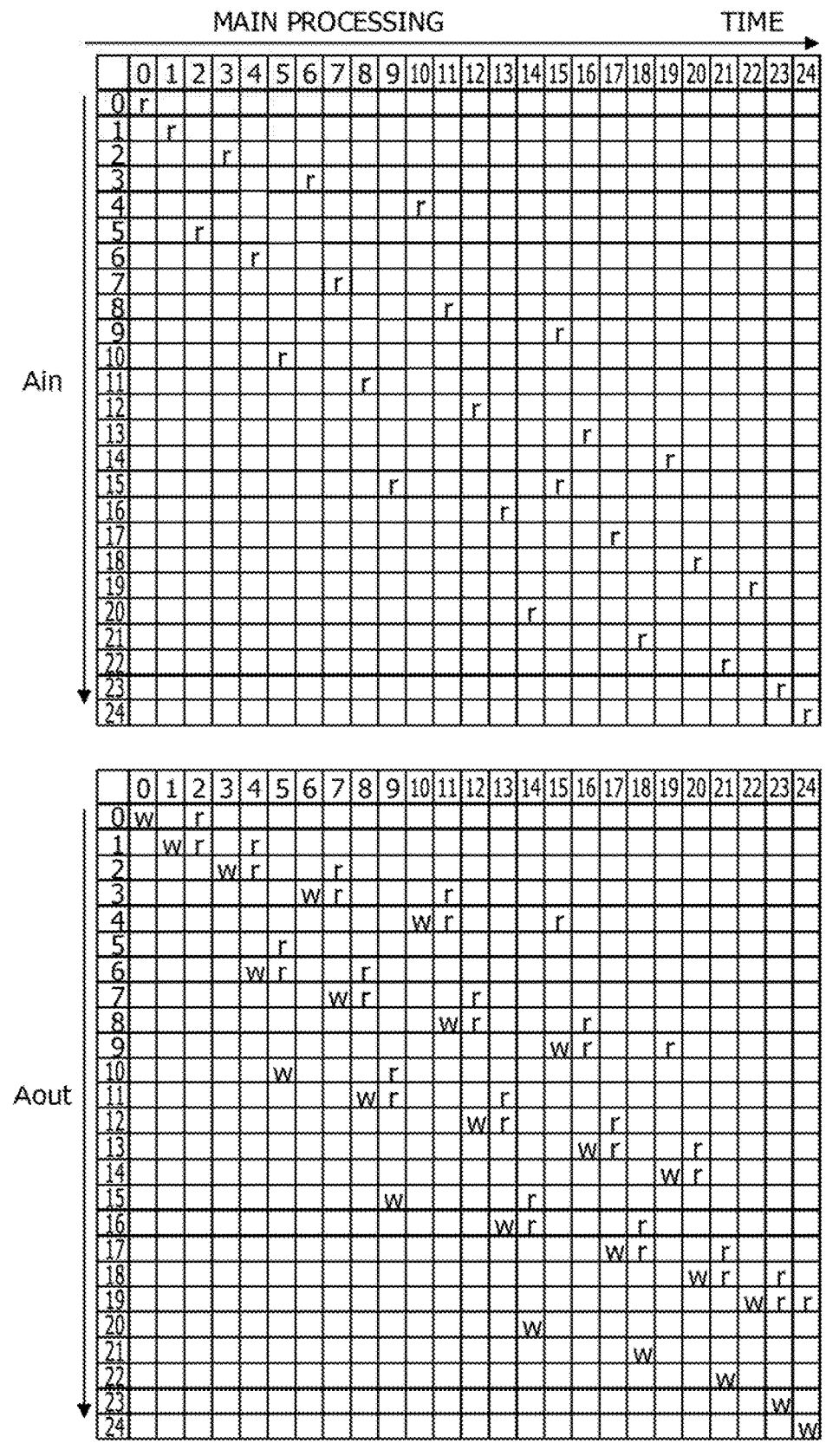

FIG. 10 illustrates an example of orders of the data writes and the data reads included in the main processing when the execution order change processing is ended.

The conversion unit 212 causes the preprocessing and the main processing to overlap each other by making the start time of the main processing of FIG. 10 earlier while observing the restriction of the execution order for each element of in[y][x].

Comparing the preprocessing of FIGS. 6A and 6B and the main processing of FIG. 10 with each other, among the 25 elements of in[y][x], in[0][4] corresponding to Ain=4 has the shortest interval between the data write in the preprocessing and the data read in the main processing. The preprocessing and the main processing are therefore caused to overlap each other so that the data read for in[0][4] is executed immediately after the data write for in[0][4], whereby the start time of the main processing can be made earlier as much as possible.

Figure 11A:
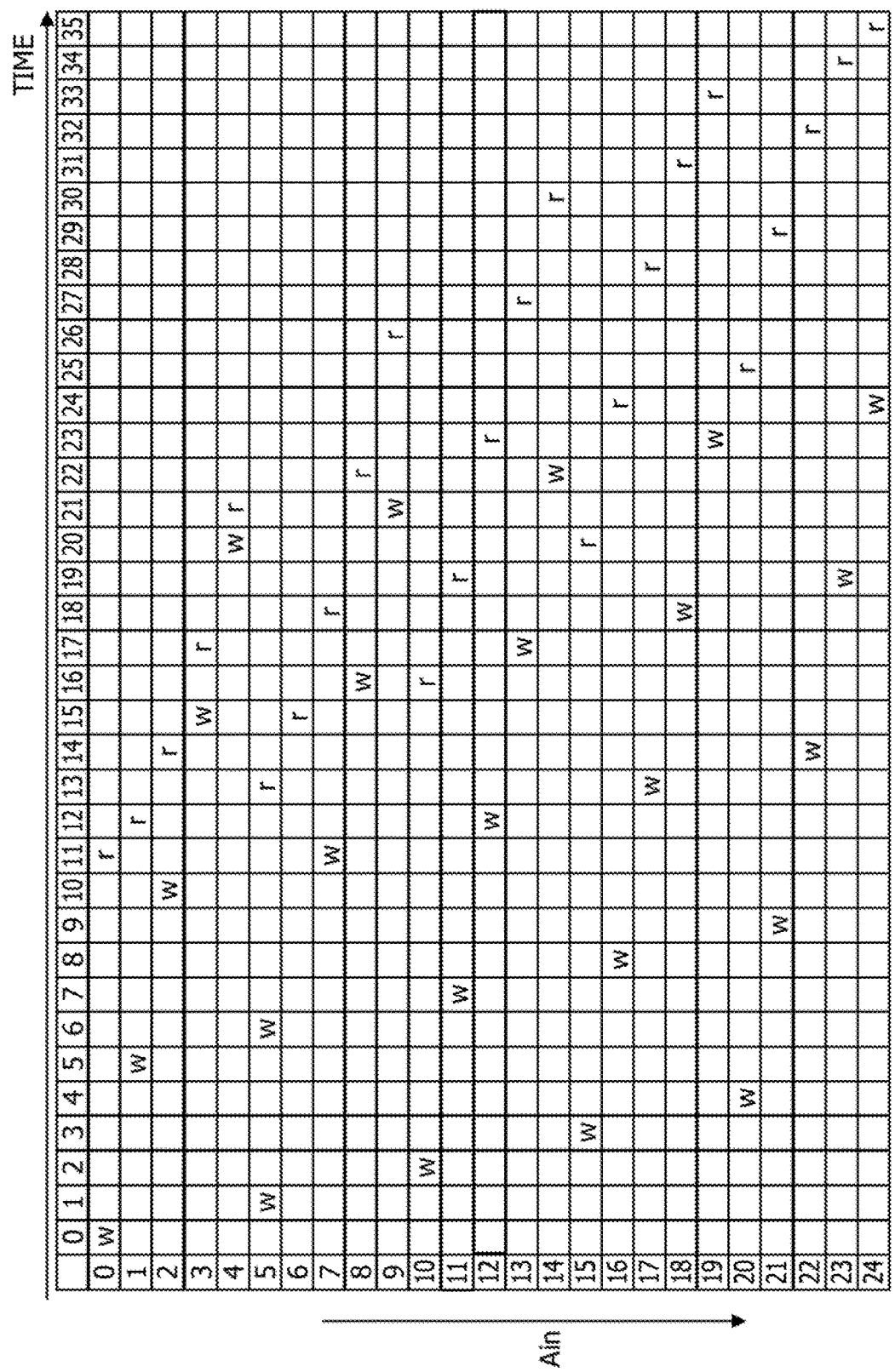
FIGS. 11A and 11B are a diagram illustrating orders of the data writes and the data reads included in the preprocessing and main processing caused to overlap each other.
Figure 11B:
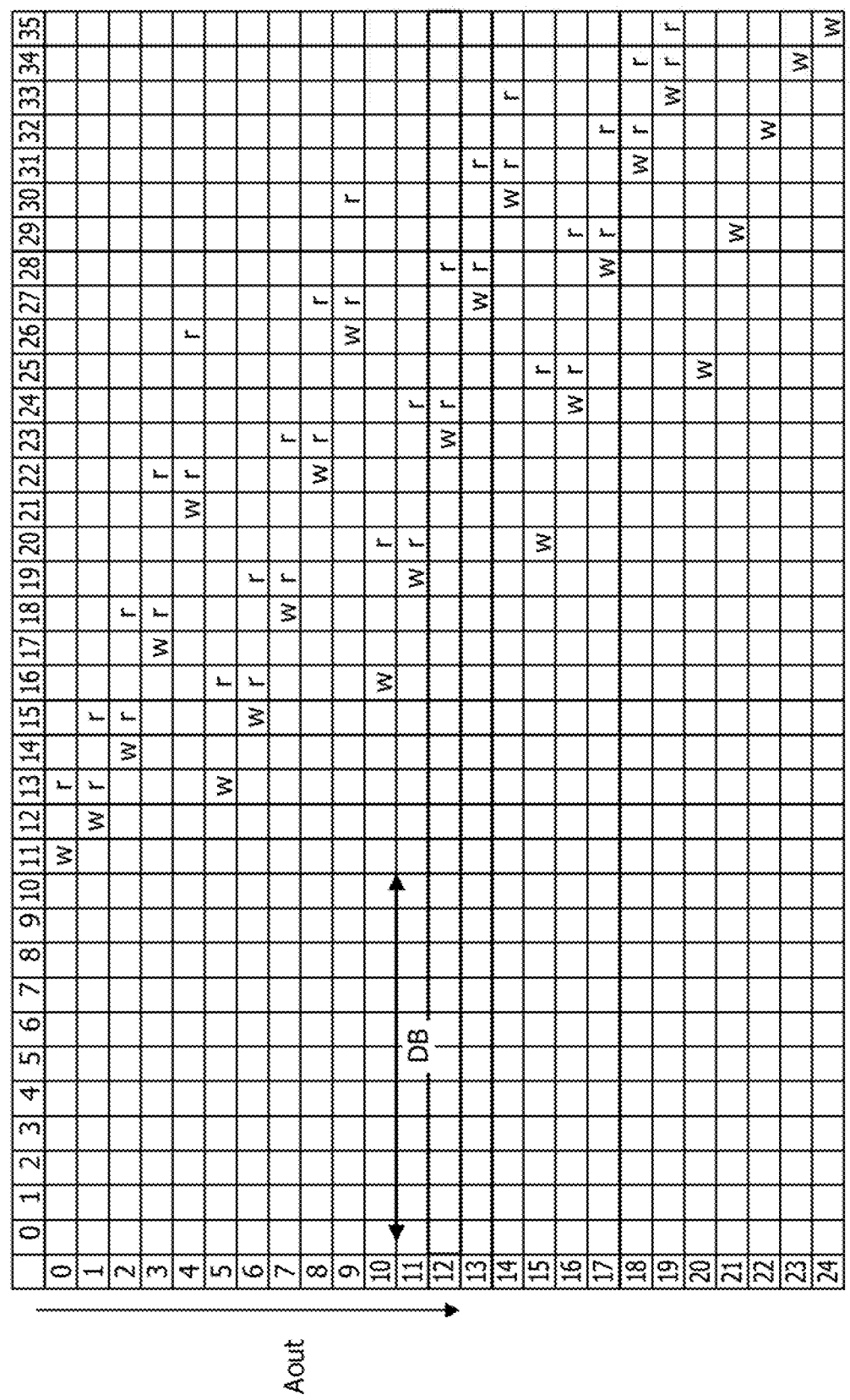

FIGS. 11A and 11B illustrate an example of orders of the data writes and the data reads included in the preprocessing and main processing caused to overlap each other. In FIGS. 11A and 11B, the data write for in[0][4] is executed at the time 20, and the data read for in[0][4] is executed at the time 21. A delay time DB from the start time 0 of the preprocessing to the start time 11 of the main processing is 11, and is reduced from the delay time DA of FIGS. 6A and 6B by 14. Thus, the total execution time of the preprocessing and the main processing is also shortened by 14.

Figure 12:
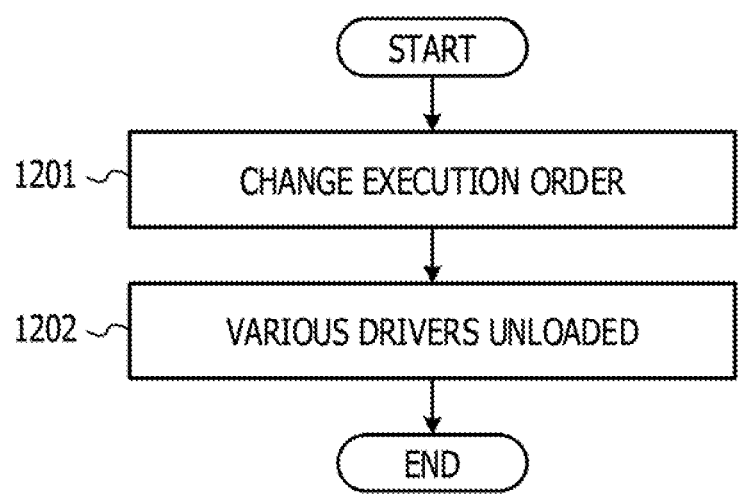
FIG. 12 is a flowchart illustrating a specific example of the conversion processing.

FIG. 12 is a flowchart illustrating a specific example of the conversion processing performed by the conversion unit 212. First, the conversion unit 212 changes an order of operation units included in the second processing by performing the execution order change processing using the first execution information 221 (step 1201). Next, the conversion unit 212 changes the start time of the second processing after the change by performing start time change processing (step 1202). Then, the conversion unit 212 outputs the second execution information 222 including the first processing and the second processing after the change (step 1203).

The second execution information 222 output is used, whereby a pipeline circuit can be manufactured that efficiently executes pipeline processing.

Figure 13A:
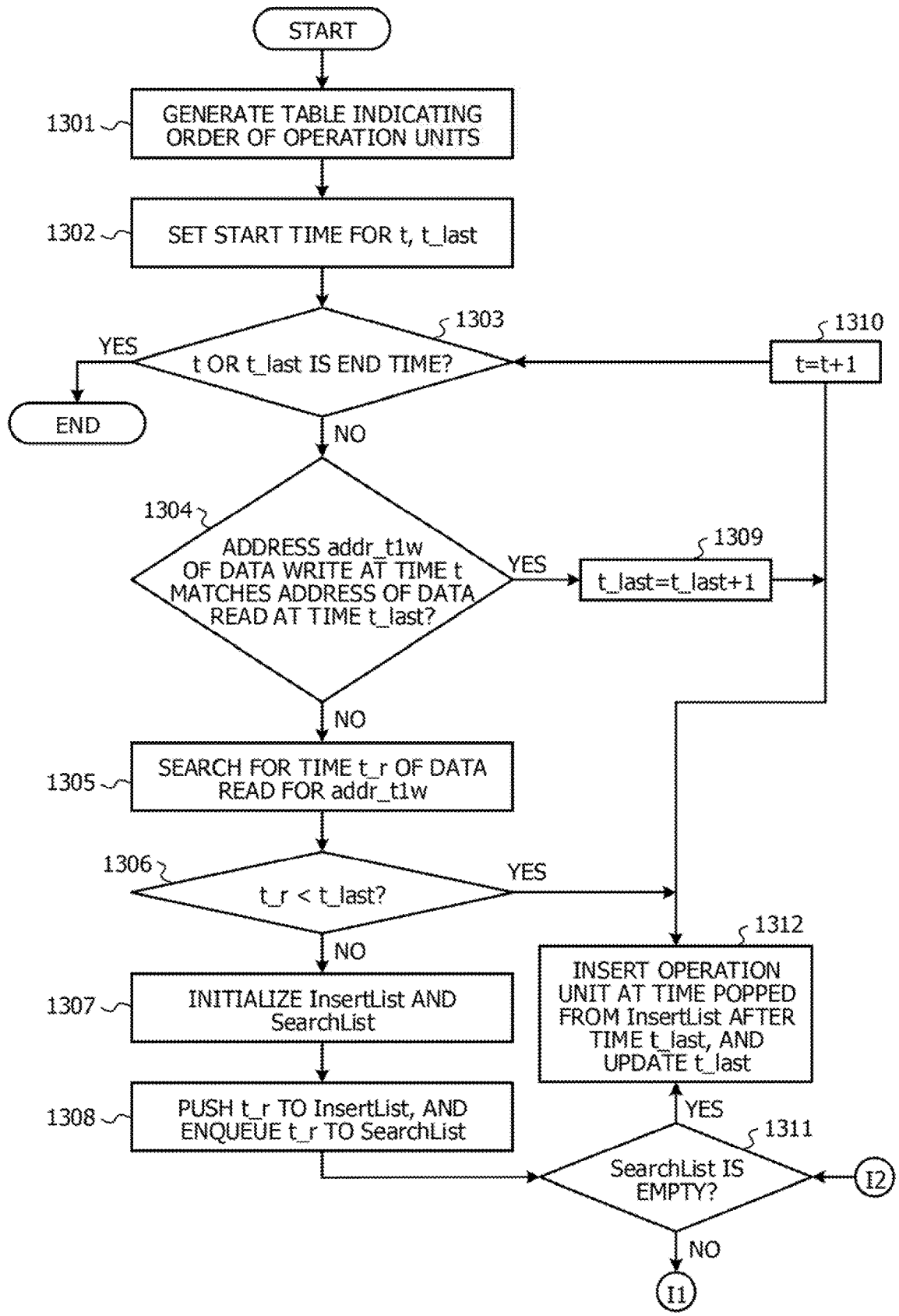
FIG. 13A is a flowchart (part 1) of the execution order change processing.
Figure 13B:
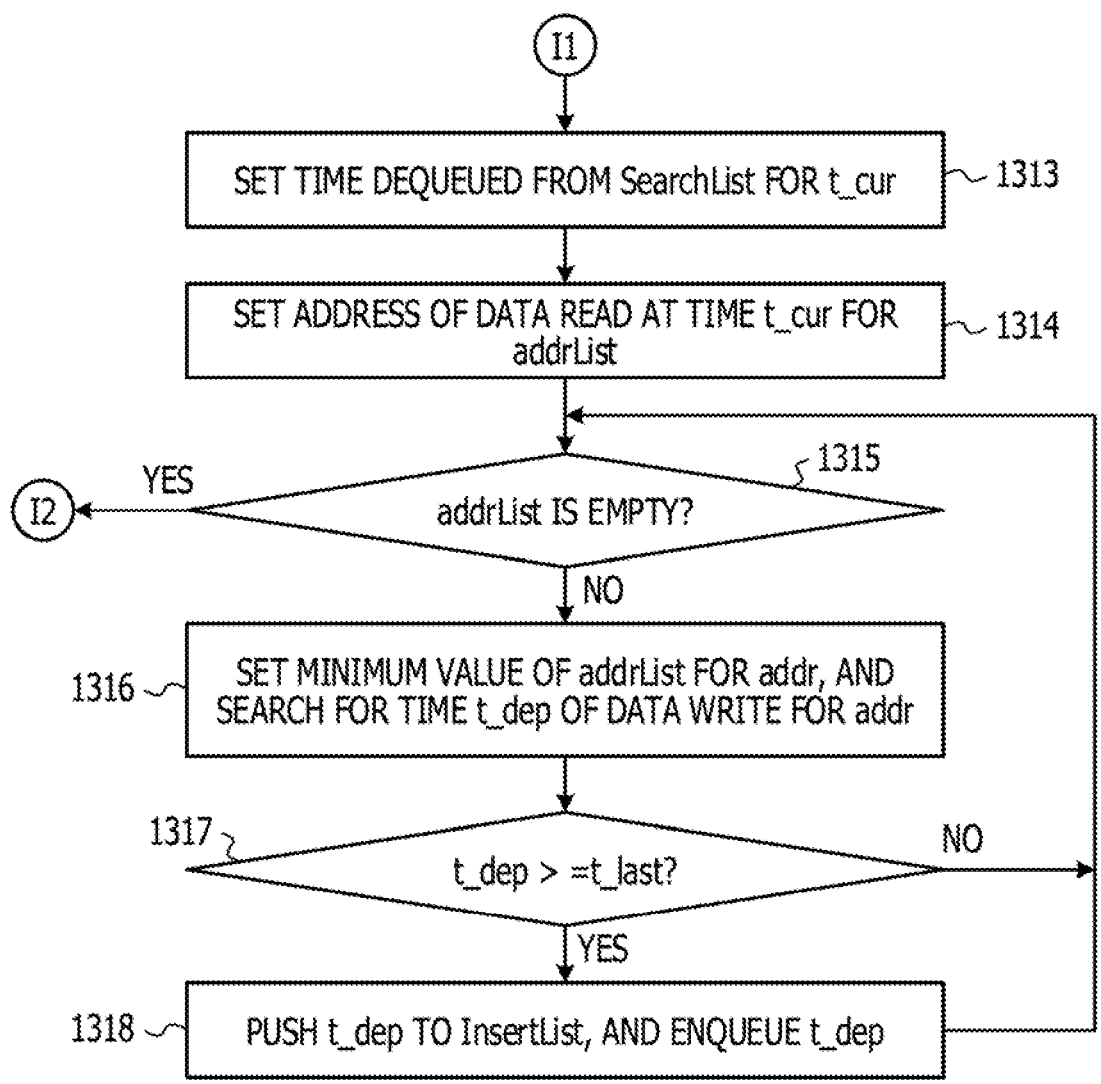
FIG. 13B is a flowchart (part 2) of the execution order change processing.

FIGS. 13A and 13B are flowcharts illustrating an example of the execution order change processing in step 1201 of FIG. 12. First, the conversion unit 212 extracts one or more processes for writing one data from the first processing and the second processing, and with the extracted processes as an operation unit, generates a table indicating orders of a data write and a data read included in the operation unit (step 1301). As a result, for example, a table as illustrated in FIGS. 6A and 6B is generated.

In each row of the table, an address is set of data to be written by each data write, and in each column, a time is set at which each operation unit is to be executed. Each operation unit may include only the data write, may include the data read and the data write, and may include the data read, the data operation, and the data write. The conversion unit 212 may generate a table of the main processing of FIG. 7 instead of a table of the main processing of FIGS. 6A and 6B as a table of the second processing.

Next, the conversion unit 212 sets the start time of the first processing for a variable t indicating a time in the first processing, and sets the start time of the second processing for a variable t_last indicating a time in the second processing (step 1302). Then, the conversion unit 212 checks whether or not either t or t_last matches the end time (step 1303).

In a case where neither t nor t_last matches the end time (step 1303, NO), the conversion unit 212 acquires an address addr_t1w of data to be written by a data write of the first processing at the time t. Then, the conversion unit 212 compares addr_t1w with an address of data to be written by a data write of the first processing and to be read by a data read of the second processing at the time t_last (step 1304).

In a case where addr_t1w matches the address of the data to be read (step 1304, YES), conversion unit 212 increments the time t_last by 1 (step 1309) and increments the time t by 1 (step 1310). Then, the conversion unit 212 repeats the processing of step 1303 and subsequent steps.

On the other hand, in a case where addr_t1w does not match the address of the data to be read (step 1304, NO), the conversion unit 212 searches for a time t_r at which a data read that reads data from addr_t1w is executed in the second processing (step 1305). Then, the conversion unit 212 compares t_r with t_last (step 1306). In a case where t_r is before t_last (step 1306, YES), the conversion unit 212 performs the processing of step 1310 and subsequent steps.

On the other hand, in a case where t_r is after t_last (step 1306, NO), the conversion unit 212 initializes a stack structure list InsertList and a queue structure list SearchList (step 1307). The stack structure is a Last In First Out (LIFO) structure, and the queue structure is a First In Last Out (FILO) structure. InsertList stores a time at which an operation unit to be moved is executed, and SearchList stores a time to be recursively found. InsertList and SearchList are initialized, whereby these lists are empty.

Next, the conversion unit 212 pushes t_r to InsertList and enqueues t_r to SearchList (step 1308). Then, the conversion unit 212 checks whether or not SearchList is empty (step 1311).

In a case where SearchList is not empty (step 1311, NO), the conversion unit 212 sets a time dequeued from SearchList for t_cur (step 1313).

Next, the conversion unit 212 sets an address of one or more data to be written by a data write of the second processing and to be read by a data read at the time t_cur for a list addrList (step 1314). Then, the conversion unit 212 checks whether or not addrList is empty (step 1315).

In a case where addrList is not empty (step 1315, NO), the conversion unit 212 takes out an earliest time (minimum value) from addrList and sets the earliest time for an address addr (step 1316). Then, in the second processing, the conversion unit 212 searches for a time t_dep at which a data write that writes data to addr is executed.

Next, the conversion unit 212 compares t_dep with t_last (step 1317). In a case where t_dep is before t_last (step 1317, NO), the conversion unit 212 repeats the processing of step 1315 and subsequent steps.

On the other hand, in a case where t_dep is after t_last (step 1317, YES), the conversion unit 212 pushes t_dep to InsertList and enqueues t_dep to SearchList (step 1318). Then, the conversion unit 212 repeats the processing of step 1315 and subsequent steps.

In a case where addrList is empty (step 1315, YES), the conversion unit 212 repeats the processing of step 1311 and subsequent steps. Then, in a case where SearchList is empty (step 1311, YES), the conversion unit 212 inserts an operation unit executed at a time popped from InsertList at a time after t_last in the order of the time popped (step 1312).

Moreover, the conversion unit 212 changes the order of the operation units so that an operation unit at a time not popped from InsertList among times after t_last is executed after the inserted operation unit. Then, the conversion unit 212 updates t_last by adding the number of pieces of the time popped from InsertList to t_last, and repeats the processing of step 1310 and subsequent steps.

Then, in a case where either t or t_last matches the end time (step 1303, YES), the conversion unit 212 ends the processing.

For example, in step 1301, in a case where the table of the preprocessing of FIGS. 6A and 6B is generated as a table of the first processing, and the table of the main processing of FIG. 7 is generated as a table of the second processing, in step 1302, t=t_last=0 is set.

At this time, addr_t1w indicates Ain=0. In FIG. 7, the address of the data to be read by the data read at the time 0 is 0, and matches addr_t1w. Thus, t_last and t are incremented by 1.

Next, in the case of t=t_last=1, addr_t1w=5 is set. In FIG. 7, the address of the data to be read by the data read at the time 1 is 1, and does not match addr_t1w. Thus, t_r=5 is set, and InsertList=[5] and SearchList=[5] are set.

When the time 5 is dequeued from SearchList, SearchList=[ ] (empty) ant t_cur=5 are set. In FIG. 7, the addresses Aout of data to be read by the data reads at the time 5 are 0 and 1. Thus, addrList=[0, 1] is set.

Next, 0 is taken out from addrList, and addr=0 is set. In FIG. 7, since the time of a data write that writes data to Aout=0 is 0, t_dep=0 is set. Since t_dep is before t_last, 1 is taken out from addrList, and addr=1 is set. In FIG. 7, since the time of a data write that writes data to Aout=1 is 1, t_dep=t_last=1 is set. Thus, the time 1 is pushed to InsertList, the time 1 is enqueued to SearchList, and InsertList=[1, 5] and SearchList=[1] are set.

When the time 1 is dequeued from SearchList, SearchList=[ ] and t_cur=1 are set. In FIG. 7, the address of data to be read by the data read at the time 1 is only Ain=1, and no data is read from Aout. Thus, addrList=[ ] is set, and SearchList=[ ] is maintained.

The time 1 and the time 5 are therefore popped in order from InsertList=[1, 5], and the operation units at those times are inserted at the time 1 and time 2, respectively, as illustrated in FIG. 9. Then, the operation units at the time 2 to the time 4 move to the time 3 to the time 5, respectively, and t_last=3 is set, and t=2 is set.

Next, in the case of t=2 and t_last=3, addr_t1w=10 is set. In the main processing of FIG. 9, the address of data to be read by the data read at the time 3 is 2, and does not match addr_t1w. Thus, t_r=10 is set, and InsertList=[10] and SearchList=[10] are set.

When the time 10 is dequeued from SearchList, SearchList=[ ] and t_cur=10 are set. In the main processing of FIG. 9, the addresses Aout of data to be read by the data reads at the time 10 are 5 and 6. Thus, addrList=[5, 6] is set.

Next, 5 is taken out from addrList, and addr=5 is set. In the main processing of FIG. 9, since the time of a data write that writes data to Aout=5 is 2, t_dep=2 is set. Since t_dep is before t_last, 6 is taken out from addrList, and addr=6 is set. In the main processing of FIG. 9, since the time of a data write that writes data to Aout=6 is 6, t_dep=6 is set. Since t_dep is after t_last, the time 6 is pushed to InsertList, the time 6 is enqueued to SearchList, and InsertList=[6, 10] and SearchList=[6] are set.

When the time 6 is dequeued from SearchList, SearchList=[ ] and t_cur=6 are set. In the main processing of FIG. 9, the addresses Aout of data to be read by the data reads at the time 6 are 1 and 2. Thus, addrList=[1, 2] is set.

Next, 1 is taken out from addrList, and addr=1 is set. In the main processing of FIG. 9, since the time of a data write that writes data to Aout=1 is 2, t_dep=2 is set. Since t_dep is before t_last, 2 is taken out from addrList, and addr=2 is set. In the main processing of FIG. 9, since the time of a data write that writes data to Aout=2 is 3, t_dep=t_last=3 is set. Thus, the time 3 is pushed to InsertList, the time 3 is enqueued to SearchList, and InsertList=[3, 6, 10] and SearchList=[3] are set.

When the time 3 is dequeued from SearchList, SearchList=[ ] and t_cur=3 are set. In the main processing of FIG. 9, the address of data to be read by the data read at the time 3 is only Ain=2, and no data is read from Aout. Thus, addrList=[ ] is set, and SearchList=[ ] is maintained.

The time 3, the time 6, and the time 10 are therefore popped in order from InsertList=[3, 6, 10], and the operation units at those times are inserted at the time 3, the time 4, and the time 5, respectively. Then, the operation units at the time 4, the time 5, and the time 7 to the time 9 move after the time 6, and t_last=6 is set, and t=3 is set.

Thereafter, similar operation is repeated while t is incremented, whereby the table of FIG. 7 is converted into the table illustrated in FIG. 10.

According to the execution order change processing of FIGS. 13A and 13B, addr_t1w is updated while t is incremented, whereby data in the first processing is selected in order in accordance with the order of the data writes in the first processing. Next, the search is performed for the time t_r of the data read that reads data from addr_t1w, whereby the specific operation unit including the data read that reads the selected data is selected from the operation units included in the second processing.

Then, in the case where t_r is after t_last, InsertList is generated, and the operation unit of the time popped from InsertList is inserted at the time after t_last. As a result, in a case where there is an operation unit including a data read that reads data written after the selected data between the start time of the main processing and the time of the specific operation unit, the order of the operation units is changed so that the time of the specific operation units is made earlier.

Furthermore, the time t_dep of a data write that writes data to the minimum value of addrList is pushed to InsertList, and in the order of the times popped from InsertList, the operation units of the times are inserted at the time after t_last. As a result, the restriction of the execution order is observed for each data in the second processing.

Moreover, t_dep is enqueued to SearchList, and the address of data to be read by the data read at the time dequeued from SearchList is set for addrList. As a result, the operation unit that generates data to be read by the selected operation unit is recursively identified, and the order of the operation units is changed so that the identified operation unit is executed before the selected operation unit.

Figure 14:
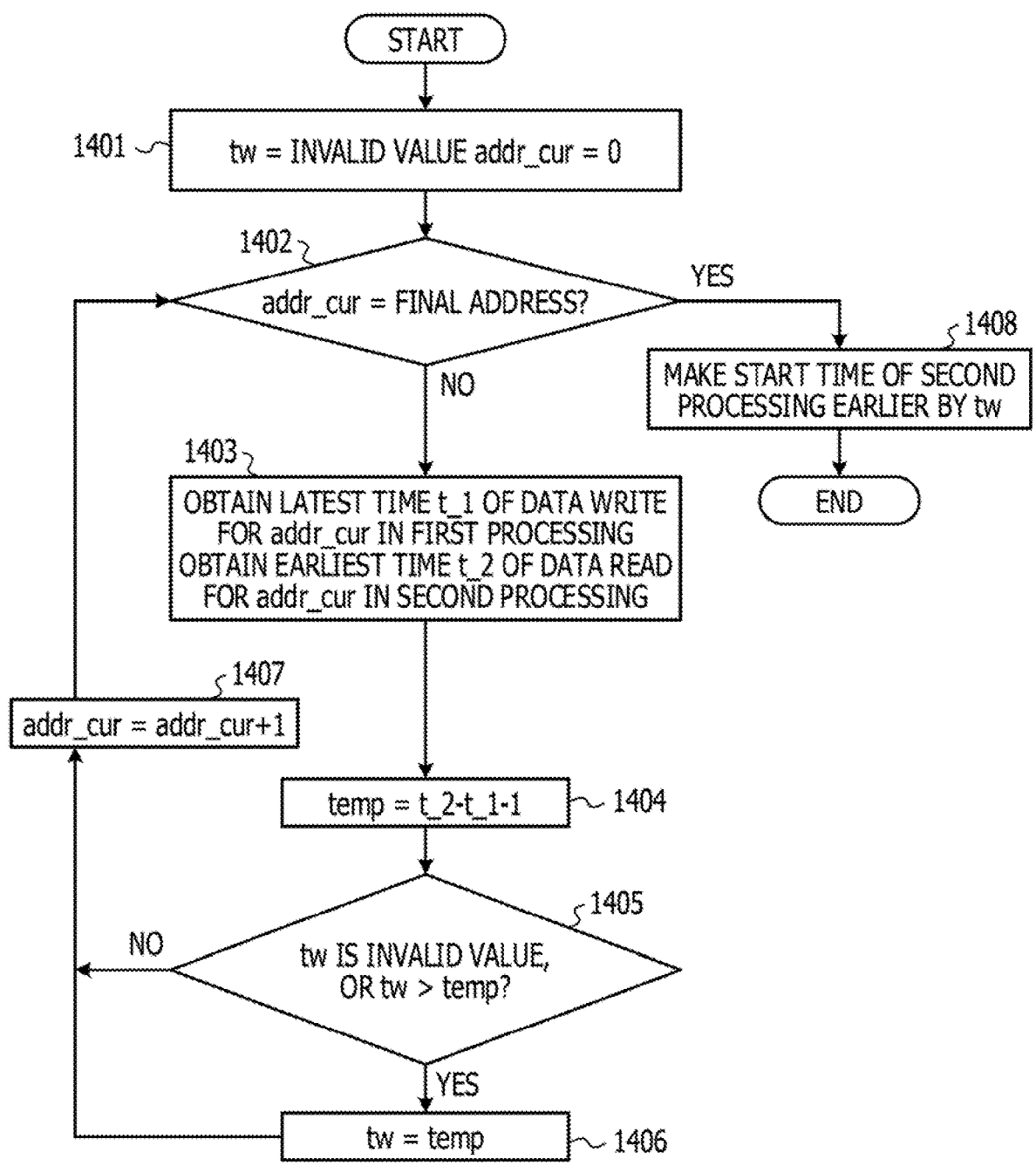
FIG. 14 is a flowchart of start time change processing.

FIG. 14 is a flowchart illustrating an example of the start time change processing in step 1202 of FIG. 12. First, the conversion unit 212 sets an invalid value (for example, −1) for a variable tw indicating a time width in which the first processing and the second processing are caused to overlap each other, and sets an initial value 0 for a variable addr_cur indicating an address of data (step 1401). Then, the conversion unit 212 compares addr_cur with a final address of data to be written by the data write in the first processing (step 1402).

In a case where addr_cur is not the final address of the data (step 1402, NO), the conversion unit 212 obtains a latest time t_1 among the times at which a data write that writes data to addr_cur is executed in the first processing (step 1403). Furthermore, the conversion unit 212 obtains an earliest time t_2 among the times at which a data read that reads data from addr_cur is executed in the second processing. Then, the conversion unit 212 calculates a time width temp by the following equation (step 1404).

$$temp = t\_2 - t\_1 - 1 \qquad (3)$$

Next, the conversion unit 212 checks the value of tw (step 1405). In a case where tw is an invalid value or greater than temp (step 1405, YES), the conversion unit 212 sets the value of temp for tw (step 1406). Then, the conversion unit 212 increments addr_cur by 1 (step 1407), and repeats the processing of step 1402 and subsequent steps.

On the other hand, in a case where tw is not an invalid value and is less than or equal to temp (step 1405, NO), the conversion unit 212 increments addr_cur by 1 (step 1407), and repeats the processing of step 1402 and subsequent steps.

Then, in a case where addr_cur reaches the final address of the data (step 1402, YES), the conversion unit 212 makes the start time of the second processing earlier by tw (step 1408). As a result, the second processing and the first processing can be caused to overlap each other.

For example, in a case where the preprocessing of FIGS. 6A and 6B and the main processing of FIG. 10 are caused to overlap with each other, the conversion unit 212 changes the time 0 to the time 24 in the main processing of FIG. 10 to the time 25 to the time 49, and then starts the start time change processing. In this case, the final address of in[y][x] written by the data write in the first processing is Ain=24.

First, when addr_cur=0 is set, since the time at which the data write that writes data to addr_cur is executed in the preprocessing is 0, t_1=0 is set. Furthermore, since the time at which the data read that reads data from addr_cur is executed in the main processing is 25, t_2=25 is set. Thus, temp=25−0−1=24 is set. Since tw is an invalid value, tw=temp=24 is set, and addr_cur is incremented by 1.

Next, when addr_cur=1 is set, since the time at which the data write that writes data to addr_cur is executed in the preprocessing is 5, t_1=5 is set. Furthermore, since the time at which the data read that reads data from addr_cur is executed in the main processing is 26, t_2=26 is set. Thus, temp=26−5−1=20 is set. Since tw>temp is satisfied, tw=temp=20 is set, and addr_cur is incremented by 1.

Next, when addr_cur=2 is set, since the time at which the data write that writes data to addr_cur is executed in the preprocessing is 10, t_1=10 is set. Furthermore, since the time at which the data read that reads data from addr_cur is executed in the main processing is 28, t_2=28 is set. Thus, temp=28−10−1=17 is set. Since tw>temp is satisfied, tw=temp=17 is set, and addr_cur is incremented by 1.

Next, when addr_cur=3 is set, since the time at which the data write that writes data to addr_cur is executed in the preprocessing is 15, t_1=15 is set. Furthermore, since the time at which the data read that reads data from addr_cur is executed in the main processing is 31, t_2=31 is set. Thus, temp=31−15−1=15 is set. Since tw>temp is satisfied, tw=temp=15 is set, and addr_cur is incremented by 1.

Next, when addr_cur=4 is set, since the time at which the data write that writes data to addr_cur is executed in the preprocessing is 20, t_1=20 is set. Furthermore, since the time at which the data read that reads data from addr_cur is executed in the main processing is 35, t_2=35 is set. Thus, temp=35−20−1=14 is set. Since tw>temp is satisfied, tw=temp=14 is set, and addr_cur is incremented by 1.

Thereafter, even if similar operation is repeated while addr_cur is incremented, since tw temp is satisfied, tw is not updated, and when addr_cur=24 is set, the start time of the main processing is made earlier by 14. As a result, as illustrated in FIGS. 11A and 11B, the start time of the main processing is changed from the time 25 to the time 11, and the total execution time of the preprocessing and the main processing is shortened by 14.

Incidentally, the conversion unit 212 may omit the execution order change processing in step 1201 of FIG. 12, and perform only the start time change processing in step 1202. For example, in a case where the preprocessing and the main processing of FIGS. 6A and 6B are caused to overlap each other, the start time change processing is performed in the following procedure.

First, when addr_cur=0 is set, since the time at which the data write that writes data to addr_cur is executed in the preprocessing is 0, t_1=0 is set. Furthermore, since the time at which the data read that reads data from addr_cur is executed in the main processing is 25, t_2=25 is set. Thus, temp=25−0−1=24 is set. Since tw is an invalid value, tw=temp=24 is set, and addr_cur is incremented by 1.

Next, when addr_cur=1 is set, since the time at which the data write that writes data to addr_cur is executed in the preprocessing is 5, t_1=5 is set. Furthermore, since the time at which the data read that reads data from addr_cur is executed in the main processing is 26, t_2=26 is set. Thus, temp=26−5−1=20 is set. Since tw>temp is satisfied, tw=temp=20 is set, and addr_cur is incremented by 1.

Next, when addr_cur=2 is set, since the time at which the data write that writes data to addr_cur is executed in the preprocessing is 10, t_1=10 is set. Furthermore, since the time at which the data read that reads data from addr_cur is executed in the main processing is 27, t_2=27 is set. Thus, temp=27−10−1=16 is set. Since tw>temp is satisfied, tw=temp=16 is set, and addr_cur is incremented by 1.

Next, when addr_cur=3 is set, since the time at which the data write that writes data to addr_cur is executed in the preprocessing is 15, t_1=15 is set. Furthermore, since the time at which the data read that reads data from addr_cur is executed in the main processing is 28, t_2=28 is set. Thus, temp=28−15−1=12 is set. Since tw>temp is satisfied, tw=temp=12 is set, and addr_cur is incremented by 1.

Next, when addr_cur=4 is set, since the time at which the data write that writes data to addr_cur is executed in the preprocessing is 20, t_1=20 is set. Furthermore, since the time at which the data read that reads data from addr_cur is executed in the main processing is 29, t_2=29 is set. Thus, temp=29−20−1=8 is set. Since tw>temp is satisfied, tw=temp=8 is set, and addr_cur is incremented by 1.

Thereafter, even if similar operation is repeated while addr_cur is incremented, since tw temp is satisfied, tw is not updated, and when addr_cur=24 is set, the start time of the main processing is made earlier by 8. As a result, the start time of the main processing is changed from the time 25 to the time 17, and the total execution time of the preprocessing and the main processing is shortened by 8.

Figure 15A:
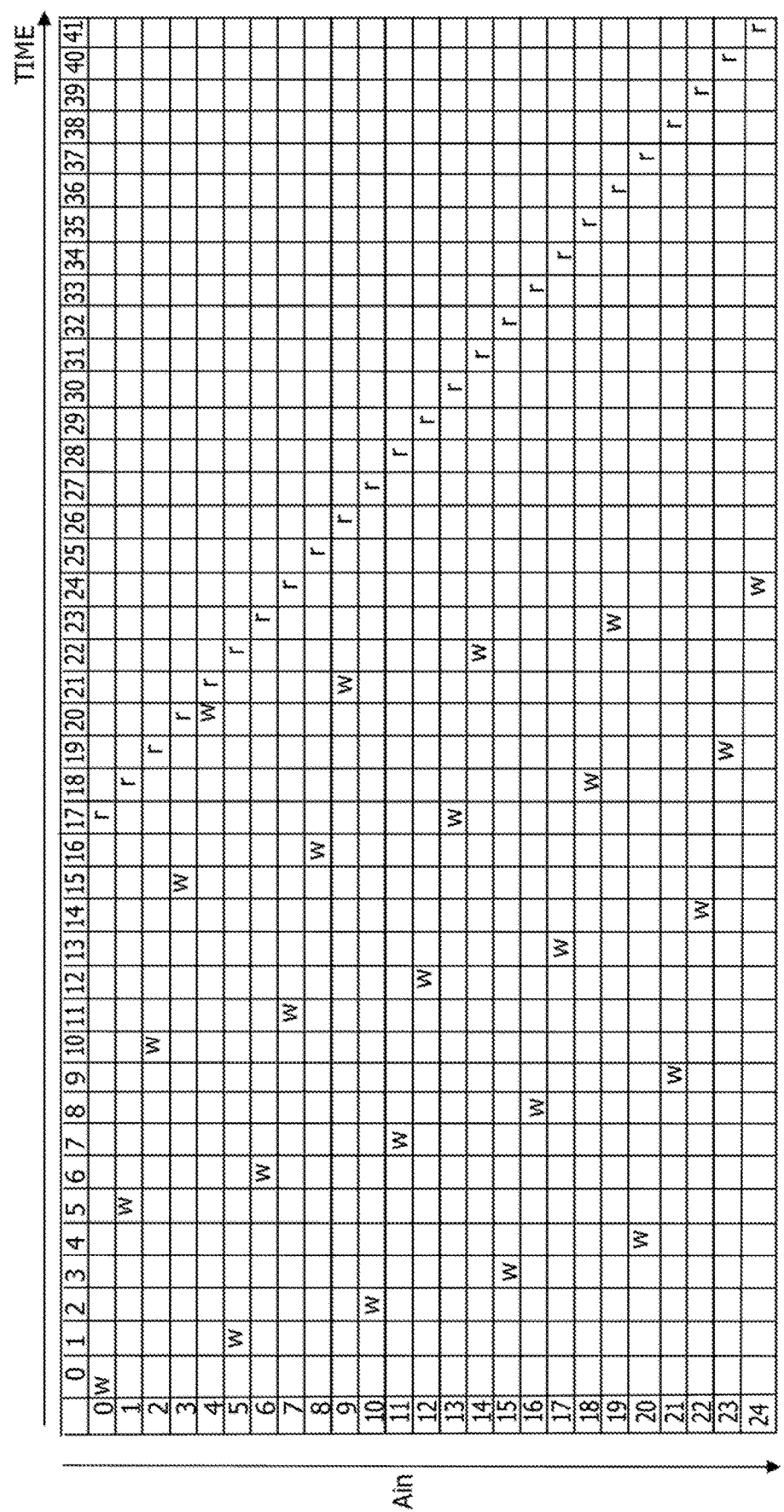

FIGS. 15A and 15B illustrate an example of orders of the data writes and the data reads in a case where the execution order change processing is omitted, and the preprocessing and the main processing of FIGS. 6A and 6B are caused to overlap each other. In FIGS. 15A and 15B, the start time of the main processing is changed from the time 25 to the time 17, and the total execution time of the preprocessing and the main processing is shortened by 8.

Note that, the conversion unit 212 can also cause the first processing and the second processing to overlap each other by start time change processing different from that of FIG. 14. For example, a method may be used of checking whether or not the time of the data write in the first processing and the time of the data read in the second processing are adjacent to each other for the address of each data write in the first processing while making the start time of the second processing earlier by 1 time every time. In this case, the processing ends when the time of the data read for one of the addresses is the time adjacent to the data write for the same address.

The configuration of the information processing device of FIG. 2 is merely an example and some constituent elements may be omitted or modified depending on the use or conditions of the information processing device.

The flowcharts illustrated in FIGS. 3 and 12 to 14 are merely examples and some processes may be omitted or modified depending on the configuration or conditions of the information processing device. For example, in a case where the order of the operation units included in the second processing is not changed, the processing of step 1201 of FIG. 12 can be omitted.

The preprocessing and the main processing illustrated in FIGS. 4 to 11 and 15 are merely examples, and the first processing and the second processing may be other types of processing having data dependency. The first processing and the second processing each are not limited to processing executed by a hardware circuit, and may be processing executed by software.

Figure 16:
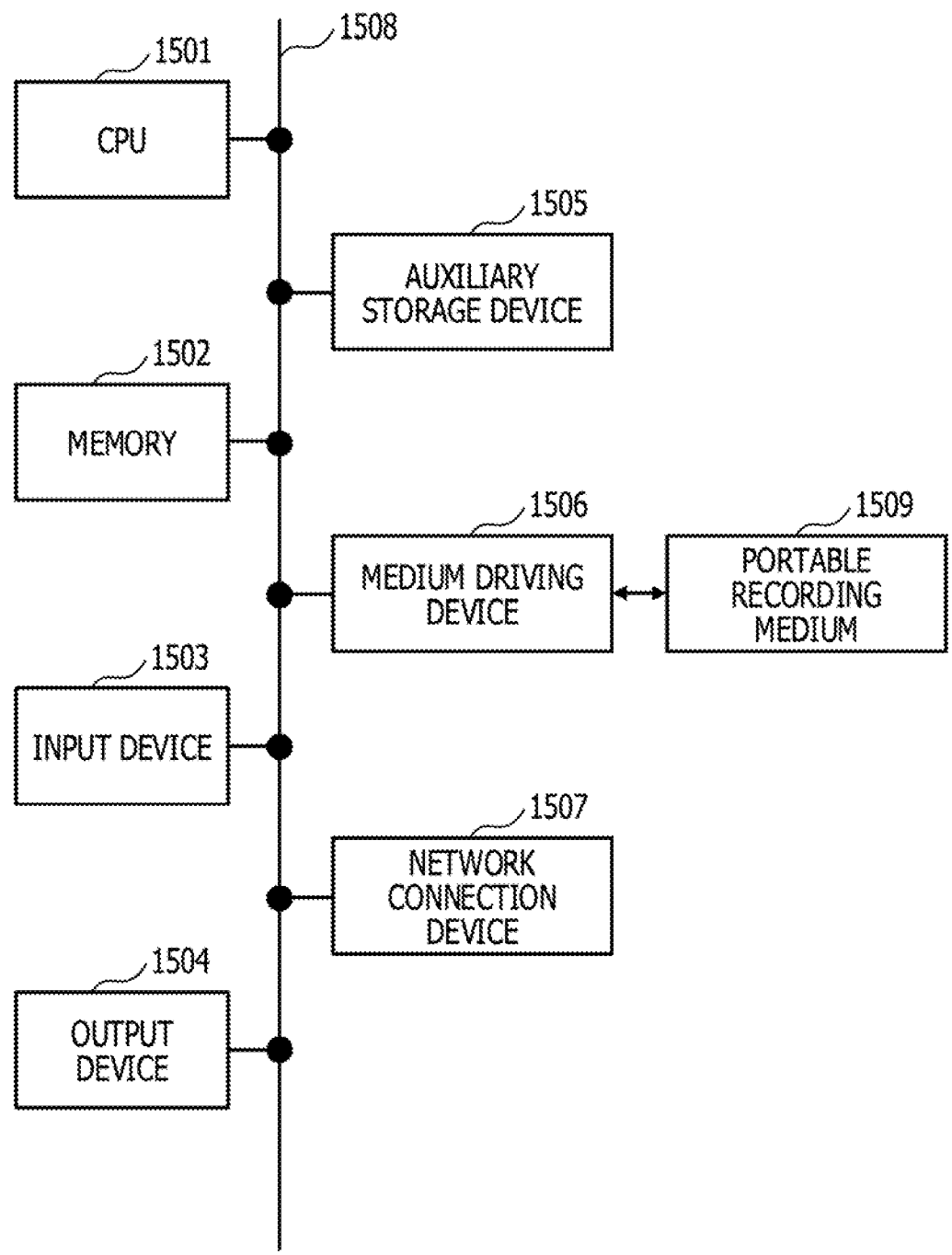
FIG. 16 is a hardware configuration diagram of the information processing device.

FIG. 16 illustrates a hardware configuration example of the information processing device of FIG. 2. The information processing device of FIG. 16 includes a central processing unit (CPU) 1501, a memory 1502, an input device 1503, an output device 1504, an auxiliary storage device 1505, a medium driving device 1506, and a network connection device 1507. These constituent elements are connected to each other by a bus 1508.

The memory 1502 is a semiconductor memory, for example, a read only memory (ROM), a random access memory (RAM), a flash memory, and the like, and stores a program and data used for processing. The memory 1502 can be used as the storage unit 211 of FIG. 2.

The CPU 1501 (processor) operates as the conversion unit 212 of FIG. 2, for example, by executing a program using the memory 1502.

The input device 1503 is, for example, a keyboard, a pointing device, or the like and is used for inputting an instruction or information from an operator or a user. The output device 1504 is, for example, a display device, a printer, a speaker, or the like and is used for an inquiry or an instruction to the operator or the user, and outputting a processing result. The processing result may be the second execution information 222.

The auxiliary storage device 1505 is, for example, a magnetic disk device, an optical disk device, a magneto-optical disk device, a tape device, or the like. The auxiliary storage device 1505 may be a hard disk drive or a flash memory. The information processing device can store programs and data in the auxiliary storage device 1505 and load these programs and data into the memory 1502 for use. The auxiliary storage device 1505 can be used as the storage unit 211 of FIG. 2.

The medium driving device 1506 drives a portable recording medium 1509 and accesses recorded contents of the portable recording medium 1509. The portable recording medium 1509 is a memory device, a flexible disk, an optical disk, a magneto-optical disk, or the like. The portable recording medium 1509 may be a compact disk read only memory (CD-ROM), a digital versatile disk (DVD), a universal serial bus (USB) memory, or the like. The operator or the user can store programs and data in the portable recording medium 1509 and load these programs and data into the memory 1502 for use.

As described above, a computer-readable recording medium in which the programs and data used for processing are stored includes a physical (non-transitory) recording medium such as the memory 1502, the auxiliary storage device 1505, and the portable recording medium 1509.

The network connection device 1507 is a communication interface circuit that is connected to a communication network such as a local area network (LAN) and a wide area network (WAN), and that performs data conversion accompanying communication. The information processing device can receive programs and data from an external device via the network connection device 1507 and load these programs and data into the memory 1502 for use.

Note that, it is not necessary for the information processing device to include all the constituent elements of FIG. 16, and some constituent elements may be omitted depending on the use or the condition. For example, in a case where an interface with the operator or the user is unnecessary, the input device 1503 and the output device 1504 may be omitted. In a case where the portable recording medium 1509 or the communication network is not used, the medium driving device 1506 or the network connection device 1507 may be omitted.

While the disclosed embodiments and the advantages thereof have been described in detail, those skilled in the art will be able to make various modifications, additions, and omissions without departing from the scope of the embodiment as explicitly set forth in the claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An information processing device comprising:
a memory; and
a processor coupled to the memory and configured to:
store first execution information that includes first processing for a plurality of data and second processing executed subsequently to the first processing;
convert the first execution information into second execution information by making a start timing of the second processing earlier than an end timing of the first processing, under a restriction of an execution order in which a data read in the second processing is executed after a data write in the first processing for each of the plurality of data, on the basis of an order of data writes included in the first processing and an order of data reads included in the second processing; and
output the second execution information.

2. The information processing device according to claim 1, wherein
the plurality of data is a plurality of first data,
the first processing includes a data write that writes each of the plurality of first data,
the second processing includes an operation unit that generates each of a plurality of second data,
the operation unit includes: a data read that reads any of the first data; a data read that reads any of the second data; a data operation that generates one of the second data that indicates an operation result by using the any of the first data read and the any of the second data read; and a data write that writes the one of the second data that indicates the operation result, and
the processor is configured to:
based on an order of data writes for the plurality of first data in the first processing and an order of operation units for the plurality of second data in the second processing, under a restriction of an execution order in which the data read is executed after the data write for each of the plurality of second data,
change the order of the operation units included in the second processing, and
make the start timing of the second processing after change earlier than the end timing of the first processing.

3. The information processing device according to claim 2, wherein the processor is configured to:
select one of the first data in accordance with the order of the data writes for the plurality of first data in the first processing;
select an operation unit that includes a data read that reads the selected one of the first data from the operation units included in the second processing and
in a case where there is an operation unit that includes a data read that reads one of the first data to be written after the selected one of the first data in the first processing between the start timing of the second processing in the first execution information and an execution timing of the selected operation unit, change the order of the operation units included in the second processing to make the execution timing of the selected operation unit earlier.

4. The information processing device according to claim 3, wherein the processor is configured to:
recursively identify an operation unit that generates one of the second data to be read by the selected operation unit; and
change the order of the operation units included in the second processing such that the identified operation unit is executed before the selected operation unit, in accordance with the restriction of the execution order in which the data read is executed after the data write for each of the plurality of second data.

5. The information processing device according to claim 1, wherein the first execution information is information that describes an execution order of data operations in a pipeline circuit that executes the first processing and the second processing.

6. A method for processing information comprising:
analyzing, by a computer, first execution information that includes first processing for a plurality of data and second processing executed subsequently to the first processing;
converting the first execution information into second execution information by making a start timing of the second processing earlier than an end timing of the first processing, under a restriction of an execution order in which a data read in the second processing is executed after a data write in the first processing for each of the plurality of data, on the basis of an order of data writes included in the first processing and an order of data reads included in the second processing; and outputting the second execution information.

7. The method according to claim 6, wherein the plurality of data is a plurality of first data, the first processing includes a data write that writes each of the plurality of first data, the second processing includes an operation unit that generates each of a plurality of second data, the operation unit includes: a data read that reads any of the first data; a data read that reads any of the second data; a data operation that generates one of the second data that indicates an operation result by using the any of the first data read and the any of the second data read; and a data write that writes the one of the second data that indicates the operation result, and the method further includes:

based on an order of data writes for the plurality of first data in the first processing and an order of operation units for the plurality of second data in the second processing, under a restriction of an execution order in which the data read is executed after the data write for each of the plurality of second data, changing the order of the operation units included in the second processing; and making the start timing of the second processing after change earlier than the end timing of the first processing.

8. The method according to claim 7, further comprising:

selecting one of the first data in accordance with the order of the data writes for the plurality of first data in the first processing; and selecting an operation unit that includes a data read that reads the selected one of the first data from the operation units included in the second processing, and in a case where there is an operation unit that includes a data read that reads one of the first data to be written after the selected one of the first data in the first processing between the start timing of the second processing in the first execution information and an execution timing of the selected operation unit; and changing the order of the operation units included in the second processing to make the execution timing of the selected operation unit earlier.

9. The method according to claim 8, further comprising:

recursively identify an operation unit that generates one of the second data to be read by the selected operation unit; and changing the order of the operation units included in the second processing such that the identified operation unit is executed before the selected operation unit, in accordance with the restriction of the execution order in which the data read is executed after the data write for each of the plurality of second data.

10. The method according to claim 6, wherein the first execution information is information that describes an execution order of data operations in a pipeline circuit that executes the first processing and the second processing.

11. A non-transitory computer-readable recording medium having stored therein a program for causing a computer to execute processing comprising:

analyzing first execution information that includes first processing for a plurality of data and second processing executed subsequently to the first processing;

converting the first execution information into second execution information by making a start timing of the second processing earlier than an end timing of the first processing, under a restriction of an execution order in which a data read in the second processing is executed after a data write in the first processing for each of the plurality of data, on the basis of an order of data writes included in the first processing and an order of data reads included in the second processing; and outputting the second execution information.

12. The non-transitory computer-readable recording medium according to claim 11, wherein the plurality of data is a plurality of first data, the first processing includes a data write that writes each of the plurality of first data, the second processing includes an operation unit that generates each of a plurality of second data, the operation unit includes: a data read that reads any of the first data; a data read that reads any of the second data; a data operation that generates one of the second data that indicates an operation result by using the any of the first data read and the any of the second data read; and a data write that writes the one of the second data that indicates the operation result, and the professing further includes:

based on an order of data writes for the plurality of first data in the first processing and an order of operation units for the plurality of second data in the second processing, under a restriction of an execution order in which the data read is executed after the data write for each of the plurality of second data, changing the order of the operation units included in the second processing; and making the start timing of the second processing after change earlier than the end timing of the first processing.

13. The non-transitory computer-readable recording medium according to claim 12, further comprising:

selecting one of the first data in accordance with the order of the data writes for the plurality of first data in the first processing;

selecting an operation unit that includes a data read that reads the selected one of the first data from the operation units included in the second processing, and in a case where there is an operation unit that includes a data read that reads one of the first data to be written after the selected one of the first data in the first processing between the start timing of the second processing in the first execution information and an execution timing of the selected operation unit; and changing the order of the operation units included in the second processing to make the execution timing of the selected operation unit earlier.

14. The non-transitory computer-readable recording medium according to claim 13, further comprising:

recursively identify an operation unit that generates one of the second data to be read by the selected operation unit; and changing the order of the operation units included in the second processing such that the identified operation unit is executed before the selected operation unit, in accordance with the restriction of the execution order in which the data read is executed after the data write for each of the plurality of second data.

15. The non-transitory computer-readable recording medium according to claim 11, wherein the first execution information is information that describes an execution order of data operations in a pipeline circuit that executes the first processing and the second processing.

\* \* \* \* \*